United States Patent
Kim et al.

(10) Patent No.: US 10,804,933 B2
(45) Date of Patent: Oct. 13, 2020

(54) QC LDPC CODE RATE MATCHING METHOD AND DEVICE THEREFOR

(71) Applicant: LG Electronics Inc., Seoul (KR)

(72) Inventors: Jinwoo Kim, Seoul (KR); Jongwoong Shin, Seoul (KR); Bonghoe Kim, Seoul (KR); Kwangseok Noh, Seoul (KR); Ilmu Byun, Seoul (KR)

(73) Assignee: LG Electronics Inc., Seoul (KR)

( * ) Notice: Subject to any disclaimer, the term of this patent is extended or adjusted under 35 U.S.C. 154(b) by 6 days.

(21) Appl. No.: 16/337,193

(22) PCT Filed: May 26, 2017

(86) PCT No.: PCT/KR2017/005529
§ 371 (c)(1),
(2) Date: Mar. 27, 2019

(87) PCT Pub. No.: WO2018/062660
PCT Pub. Date: Apr. 5, 2018

(65) Prior Publication Data
US 2019/0229751 A1      Jul. 25, 2019

Related U.S. Application Data

(60) Provisional application No. 62/401,922, filed on Sep. 30, 2016.

(51) Int. Cl.
*H03M 13/00* (2006.01)
*H03M 13/11* (2006.01)
(Continued)

(52) U.S. Cl.
CPC ......... *H03M 13/116* (2013.01); *H03M 13/00* (2013.01); *H03M 13/11* (2013.01);
(Continued)

(58) Field of Classification Search
CPC .... H03M 13/116; H03M 13/00; H03M 13/11; H03M 13/616; H04L 1/0041; H04L 1/1607; H04W 88/02
See application file for complete search history.

(56) References Cited

U.S. PATENT DOCUMENTS 10,355,822 B2 *   7/2019   Patel ............... H04L 1/0068
2011/0161772 A1   6/2011   Yoshii et al.
(Continued)

FOREIGN PATENT DOCUMENTS

| KR | 1020130023375 A | 3/2013 |
|---|---|---|
| KR | 101339120 B1 | 12/2013 |
| KR | 1020150118992 A | 10/2015 |

OTHER PUBLICATIONS

R1-166388, XP051140201: 3GPP TSG RAN WG1 #86, Aug. 22-26, 2016, Gothenburg, Sweden, Qualcomm Incorporated, "LDPC rate compatible design," (26 pages).
(Continued)

*Primary Examiner* — Christine T. Tu
(74) *Attorney, Agent, or Firm* — Dentons US LLP

(57) ABSTRACT

A quasi-cyclic low density parity check (QC LDPC) code rate matching method is disclosed. According to the rate matching method in the present disclosure, the minimum lifting value can be selected from among lifting values by which a codeword longer than a target code block can be generated. A coding gain through retransmission can be acquired by generating the codeword that is longer than the target code block. In addition, by selecting a lifting value of a proper magnitude, rate matching for information bit sequences of various lengths can be performed.

13 Claims, 19 Drawing Sheets

(51) Int. Cl.
  *H04L 1/00*   (2006.01)
  *H04L 1/16*   (2006.01)
  H04W 76/28   (2018.01)
  H04W 88/02   (2009.01)

(52) U.S. Cl.
  CPC ........ *H03M 13/616* (2013.01); *H04L 1/0041* (2013.01); *H04L 1/1607* (2013.01); *H04W 76/28* (2018.02); *H04W 88/02* (2013.01)

(56) References Cited

U.S. PATENT DOCUMENTS

2011/0307756 A1     12/2011  Nguyen et al.
2015/0381205 A1     12/2015  Zhang et al.
2020/0100225 A1*     3/2020  Khoshnevisan ...... H04L 1/1854
2020/0112965 A1*     4/2020  Kim ..................... H04L 1/1819

OTHER PUBLICATIONS

R1-166414, XP051140217: 3GPP TSG RAN WG1 #86, Aug. 22-26, 2016, Gothenburg, Sweden, ZTE Corp. et al., "Discussion on LDPC Codes for NR," (11 Pages).

R1-164183, XP051090075: 3GPP TSG RAN WG1; Meeting #85, Nanjing, China, May 23-27, 2016, Intel Corporation, LDPC Code design for NR, (4 Pages).

XP040477608: Jacobsen et al., "Introduction to LDPC Codes," LDPC Coding Proposal for LBC, Qualcomm, Alcatel et al., Mar. 15, 2007, (32 Pages).

\* cited by examiner

FIG. 7

$$H = \begin{bmatrix} P^{h^b_{00}} & P^{h^b_{01}} & P^{h^b_{02}} & \cdots & P^{h^b_{0n_b}} \\ P^{h^b_{10}} & P^{h^b_{11}} & P^{h^b_{12}} & \cdots & P^{h^b_{1n_b}} \\ \cdots & \cdots & \cdots & \cdots & \cdots \\ P^{h^b_{m_b 0}} & P^{h^b_{m_b 1}} & P^{h^b_{m_b 2}} & \cdots & P^{h^b_{m_b n_b}} \end{bmatrix} = P^{H_b}$$

$$\begin{bmatrix} 1 & 0 & 0 & 0 \\ 0 & 1 & 0 & 0 \\ 0 & 0 & 1 & 0 \\ 0 & 0 & 0 & 1 \end{bmatrix} \xrightarrow{\text{3 right shift}} \begin{bmatrix} 0 & 0 & 0 & 1 \\ 1 & 0 & 0 & 0 \\ 0 & 1 & 0 & 0 \\ 0 & 0 & 1 & 0 \end{bmatrix}$$

FIG. 18

| 89 | 159 | 26 | 300 | 301 | -1 | 148 | 120 | -1 | -1 | 132 | 22 | 234 | -1 | -1 | -1 | -1 | 5 | 318 | -1 | -1 | 113 | 247 | 0 | 0 | -1 | -1 | -1 | -1 |
|---|---|---|---|---|---|---|---|---|---|---|---|---|---|---|---|---|---|---|---|---|---|---|---|---|---|---|---|---|
| 62 | 59 | 139 | 283 | -1 | 113 | 80 | -1 | 208 | -1 | -1 | 54 | -1 | 182 | -1 | 284 | 221 | -1 | 165 | -1 | 219 | -1 | -1 | -1 | -1 | 0 | -1 | -1 | 15 |
| 168 | 92 | 78 | 36 | -1 | -1 | 181 | -1 | 171 | 290 | 93 | -1 | -1 | 37 | 223 | -1 | -1 | 107 | -1 | 65 | 98 | 120 | 276 | -1 | 0 | -1 | -1 | -1 | -1 |
| 223 | 227 | 299 | 149 | 305 | 130 | -1 | 43 | 178 | 113 | -1 | 93 | 63 | 121 | -1 | -1 | 92 | 186 | -1 | 129 | -1 | -1 | -1 | -1 | 0 | 0 | -1 | -1 | -1 |
| 275 | 176 | 93 | 92 | -1 | 151 | -1 | -1 | 248 | 66 | 269 | -1 | -1 | -1 | 135 | 16 | 197 | 177 | 97 | -1 | -1 | 0 | 143 | 0 | -1 | -1 | -1 | 0 | 0 |
| 178 | 19 | 291 | 68 | 8 | -1 | -1 | 269 | 115 | 155 | -1 | -1 | 161 | -1 | 316 | 246 | -1 | 100 | -1 | 259 | -1 | -1 | -1 | -1 | -1 | -1 | -1 | -1 | 0 |

FIG. 19

QC LDPC CODE RATE MATCHING METHOD AND DEVICE THEREFOR

This application is a National Stage Entry of International Application No. PCT/KR2017/005529 filed May 26, 2017, which claims priority to U.S. Provisional Application No. 62/401,922 filed Sep. 30, 2016, all of which are incorporated herein by reference.

TECHNICAL FIELD

The present invention relates to a rate matching method of a channel code on a wireless communication system, and more particularly, to a quasi-cyclic low density parity check (QC LDPC) code rate matching method and an apparatus therefor.

BACKGROUND ART

Wireless communication systems have been widely deployed in order to provide various types of communication services including voice and data services. In general, a wireless communication system is a multiple access system that can support communication with multiple users by sharing available system resources (a bandwidth, transmission power, etc.). Examples of multiple access systems include code division multiple access (CDMA), frequency division multiple access (FDMA), time division multiple access (TDMA), orthogonal frequency division multiple access (OFDMA), single carrier frequency division multiple access (SC-FDMA), multi carrier frequency division multiple access (MC-FDMA), etc.

Broadcast systems as well as the aforementioned communication systems have necessarily used a channel code. As a general method for configuring a channel code, a transmitting end can encode an input symbol using an encoder and transmitted the encoded symbol. In addition, for example, a receiving end can receive the encoded symbol and decode the received symbol to restore the input symbol. In this case, the size of the input symbol and the size of the encoded symbol can be defined in different ways according to a communication system. For example, in a turbo code for data information used in a long term evolution (LTE) communication system of a 3rd generation partnership project (3GPP), the size of the input symbol is a maximum of 6144 bits and the size of the encoded symbol is 18432 (6144*3) bites. Turbo coding in an LTE communication system may be referred to by the 3GPP technical standard 36.212.

However, the LTE turbo code has characteristics whereby enhancement in performance is slight when a signal to noise ratio (SNR) exceeds a predetermined range even if being increased due to a structure of the code. In this regard, a code with a low error rate as possible can be considered, but in this case, complexity is increased.

A high error rate in a communication system can cause retransmission of unnecessary data and failure in channel reception. In addition, a code with excessively high complexity can cause delay in transmission and reception as well as can increase loads of a base station and a user equipment (UE). In particular, a next-generation communication system that requires rapid transmission and reception of data as possible requires the aforementioned problems. Accordingly, there is a need for a coding method with a low error rate and low complexity.

Particularly, regarding fifth generation mobile communication technology, URLLC (Ultra Reliable and Low-Latency Communication) has been discussed. In a URLLC scenario, it is required that an error floor should occur in a block error rate of 10-5 or less. In this case, the error floor means a point where an error rate is rarely reduced in spite of increase of an information size. In LTE turbo code, an error floor occurs in a BLER of 10-4 or less in accordance with increase of an information size. Therefore, as an alternative of a turbo code, LDPC code may be used. LDPC may achieve a low error rate while having relatively low complexity. For use of LDPC code, it is required that a detailed rate matching method should be determined.

DISCLOSURE

Technical Problem

The present invention has been devised to solve the aforementioned problems, and an object of the present invention is to provide a rate matching method for an information block of various lengths.

A further object of the present invention is to provide an apparatus for supporting the methods.

It will be appreciated by persons skilled in the art that the objects that could be achieved with the present invention are not limited to what has been particularly described hereinabove and the above and other objects that the present invention could achieve will be more clearly understood from the following detailed description.

Technical Solution

To achieve one object of the present invention, a quasi-cyclic low density parity check (QC LDPC) code rate matching method according to the present invention comprises the steps of selecting a first lifting value from a plurality of lifting values; generating a parity check matrix by using the first lifting value; generating codewords which include an information block and a parity block subsequent to the information block by encoding information bit sequence using the parity check matrix; inputting the codewords to a circular buffer having a plurality of redundancy versions; and transmitting at least a part of the codewords by sequentially outputting at least a part of the codewords corresponding to a target code rate or a length of a target code block from the circular buffer, wherein the first lifting value is a minimum lifting value among the plurality of lifting values such that a length of the information block of the codewords becomes a length of the target code block or more.

Also, the parity check matrix may be generated by scaling a preset matrix using the first lifting value, and the preset matrix may correspond to the greatest lifting value of the plurality of lifting values.

Also, a characteristic matrix of the preset matrix may include elements indicating a circular shift value of a zero(0) matrix or a preset base matrix, and the parity check matrix may be generated by performing modulo computation based on the first lifting value for the elements indicating the circular shift value of the preset base matrix.

Also, the preset base matrix may be comprised of an identity matrix of a preset size.

Also, the QC LDPC code rate matching method may further comprise the step of transmitting at least one of the length of the target code block, the target code rate and the first lifting value and information on a length of the information bit sequence to a receiving end.

Also, the QC LDPC code rate matching method may further comprise the step of partially transmitting the codewords from increased redundancy versions of the circular buffer when information indicating NACK (Negative ACKnowledgement) or DTX (Discontinuous Transmission) is received from the receiving end.

Also, encoding of the information bit sequence may include adding a bit block of a preset value to the information bit sequence such that the length of the information bit sequence corresponds to a size of the parity check matrix, generating the information block and the parity block by encoding the information bit sequence and the bit block of the preset value by using the parity check matrix, and removing a part corresponding to the bit block of the preset value from the information block.

To achieve one object of the present invention, a UE of a wireless communication system comprises a transceiver for transmitting a signal; and a processor for controlling the transceiver, wherein the processor selects a first lifting value from a plurality of lifting values, generates a parity check matrix by using the first lifting value, generates codewords which include an information block and a parity block subsequent to the information block by encoding information bit sequence using the parity check matrix, inputs the codewords to a circular buffer having a plurality of redundancy versions, and transmits at least a part of the codewords by sequentially outputting at least a part of the codewords corresponding to a target code rate or a length of a target code block from the circular buffer, and the first lifting value may be a minimum lifting value among the plurality of lifting values such that a length of the information block of the codewords becomes a length of the target code block or more.

The above-mentioned aspects of the present invention are merely a part of preferred embodiments of the present invention. Those skilled in the art will derive and understand various embodiments reflecting the technical features of the present invention from the following detailed description of the present invention.

Advantageous Effects

According to the embodiments of the present invention, the following advantages effects are as follows.

A rate matching method of QC LDPC code according to the present invention may support a code block of various lengths.

Also, the rate matching method of QC LDPC code may improve coding gain through retransmission.

It will be appreciated by persons skilled in the art that the effects that can be achieved through the present invention are not limited to what has been particularly described hereinabove and other advantages of the present

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 7 illustrates an example of a structured parity check matrix;

FIG. 8 illustrates an example of a model matrix;

FIG. 18 illustrates a characteristic matrix of a high rate code according to one embodiment;

FIG. 19 illustrates a characteristic matrix of an information part of a single parity check code according to one embodiment;

BEST MODE FOR CARRYING OUT THE INVENTION

The following descriptions are usable for various wireless access systems including CDMA (code division multiple access), FDMA (frequency division multiple access), TDMA (time division multiple access), OFDMA (orthogonal frequency division multiple access), SC-FDMA (single carrier frequency division multiple access) and the like. CDMA can be implemented by such a radio technology as UTRA (universal terrestrial radio access), CDMA 2000 and the like. TDMA can be implemented with such a radio technology as GSM/GPRS/EDGE (Global System for Mobile communications)/General Packet Radio Service/Enhanced Data Rates for GSM Evolution). OFDMA can be implemented with such a radio technology as IEEE 802.11 (Wi-Fi), IEEE 802.16 (WiMAX), IEEE 802.20, E-UTRA (Evolved UTRA), etc. UTRA is a part of UMTS (Universal Mobile Telecommunications System). 3GPP (3rd Generation Partnership Project) LTE (long term evolution) is a part of E-UMTS (Evolved UMTS) that uses E-UTRA. The 3GPP LTE employs OFDMA in DL and SC-FDMA in UL. And, LTE-A (LTE-Advanced) is an evolved version of 3GPP LTE.

For the sake of clarity, 3GPP LTE/LTE-A is mainly described, but the technical idea of the present invention is not limited thereto. Specific terms used for the embodiments of the present invention are provided to help the understanding of the present invention. These specific terms may be replaced with other terms within the scope and spirit of the present invention.

Figure 1:
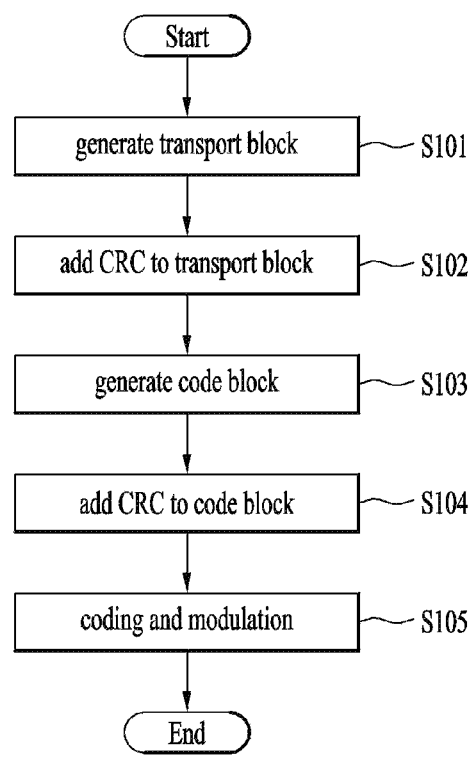
FIG. 1 illustrates a coding procedure according to an example.

FIG. 1 illustrates a coding procedure according to an example.

The coding procedure as shown in FIG. 1 may be applied to many channel codes including a turbo code used in the LTE communication system. Hereinafter, for simplicity, the coding procedure will be described based on terminology according to LTE communication system standards.

In the example of FIG. 1, the transmitting end may generate a transport block (TB) (S101). In addition, the transmitting end adds a CRC bit for the transport block to the transport block (S102). In addition, the transmitting end may generate code blocks from the transport block to which the CRC bit is added (S103). For example, the transmitting end may segment the transport block into code blocks based on the input size of the encoder. Further, the transmitting end may add a CRC bit for each divided code block (S104). In this case, for example, the code block and the code block CRC bits may be configured with a size of 6144 bits. The transmitting end may perform encoding and modulation (S105) on each block including code blocks and CRC bits. For example, turbo coding may be applied as described above.

The decoding procedure may be performed in the reverse order of the coding procedure of FIG. 1. For example, the receiving end may decode each code block using a decoder corresponding to each encoder, finally construct one transport block, and then check whether the transport block has passed the CRC.

For example, the size of the input symbols may be different from that of the transport block (TB) from the Media Access Control (MAC) layer. If the size of the transport block is larger than the maximum input symbol size of the turbo code, the transport block may be segmented into a plurality of code blocks (CB). According to the LTE communication system standard, the size of the code blocks may be equal to a result obtained by subtracting the CRC (Cyclic Redundancy Check) bits from 6144 bits. An input symbol of a turbo code may be defined as data including code blocks and CRC or data including a transport block (wherein the size of the transport block is less than, for example, 6144 bits) and CRC. The size of the CRC bits is very small (e.g., a maximum of 24 bits) compared to 6144 bits. Accordingly, in the following description, unless otherwise defined, a code block may refer to the code block itself or a CRC bit corresponding to the code block, and a transport block refers to the transport block itself or CRC bits corresponding to the transport block.

Figure 2:
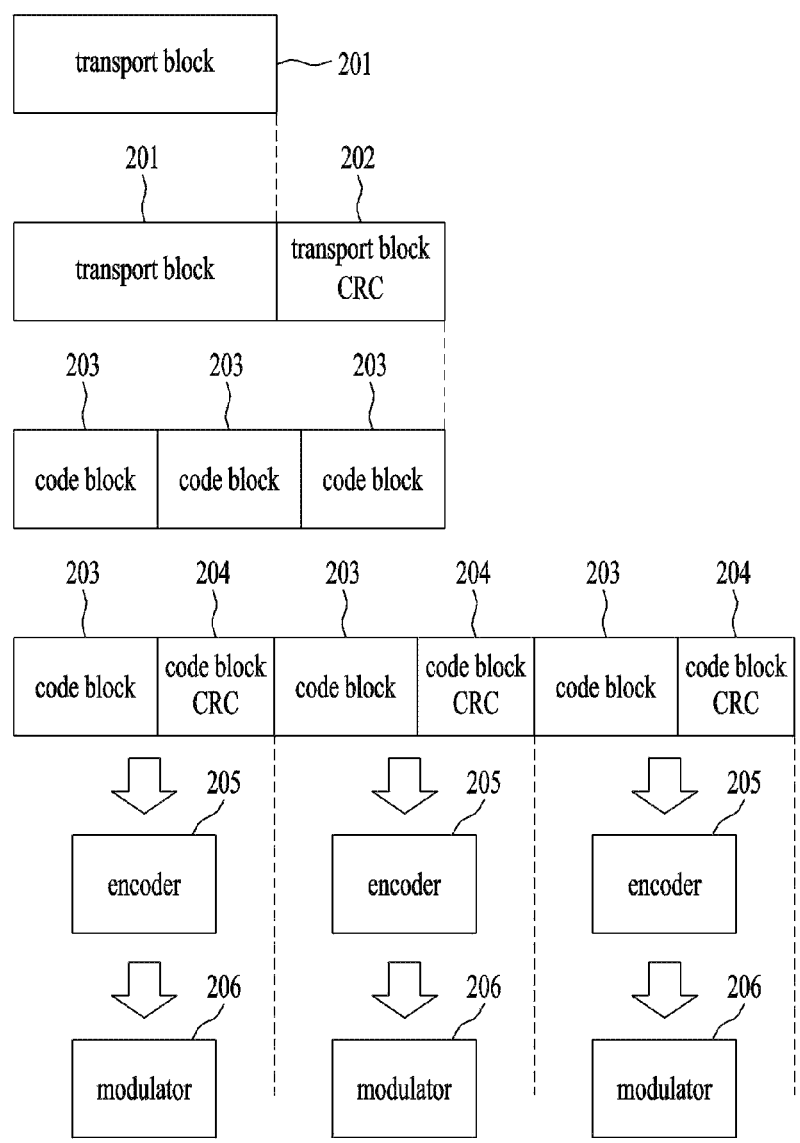
FIG. 2 illustrates a procedure of encoding a transport block according to an example.

FIG. 2 illustrates a procedure of encoding a transport block according to an example.

FIG. 2 illustrates a procedure of encoding a transport block 201 corresponding to the coding procedure described above with reference to FIG. 1. First, transport block CRC 202 is added to the transport block 201. The transport block CRC 202 may be used for identification of the transport block 201 in the decoding procedure. The transport block 201 and the transport block CRC 202 are then segmented into three code blocks 203. While the transport block 201 is segmented into three code blocks 203 in this embodiment, the transport block 201 may be segmented into a plurality of code blocks based on the input size of the encoder 205.

Code block CRC 204 is added to each of the code blocks 203. The code block CRC 204 may be used for identification of the code block 203 at the receiving end. The code blocks 203 and the code block CRC 204 may be coded via the encoder 205 and the modulator 206.

Figure 3:
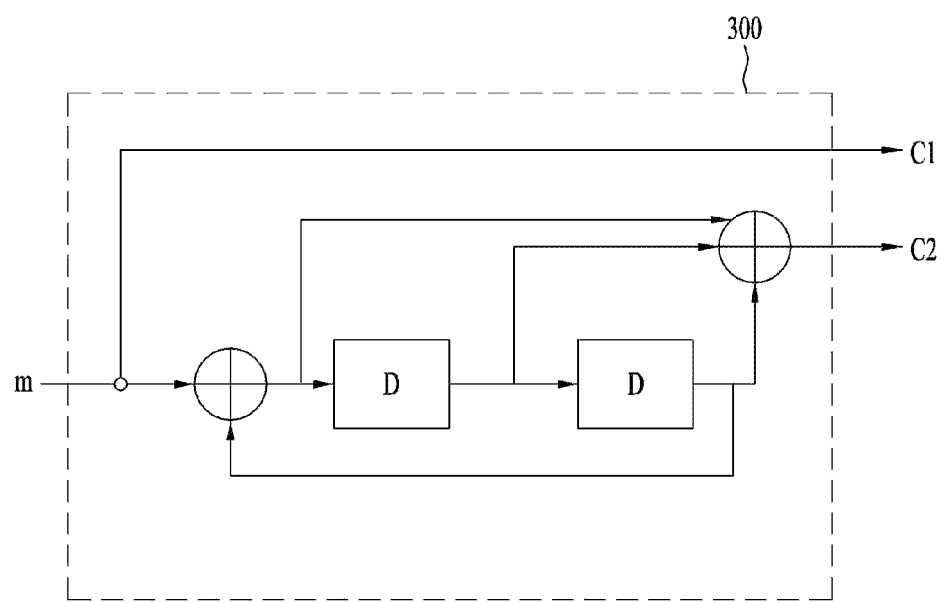
FIG. 3 illustrates a recursive systematic convolutional (RSC) encoder according to an example.

FIG. 3 illustrates a recursive systematic convolutional (RSC) encoder according to an example.

An RSC encoder 300 of FIG. 3 may be used for turbo coding. In FIG. 3, m denotes input data, C1 denotes a systematic bit string, and C2 denotes a coded bit string. Here, the RSC encoder 300 has a code rate of 1/2.

The RSC encoder 300 may be configured by feeding back a coded output to the input of a non-recursive non-systematic convolutional encoder. In the embodiment of FIG. 3, the encoder 300 includes two delay units 301, 302. The value D of the delay units 301 and 302 may be determined according to a coding scheme. The delay unit 301, 302 may include a memory or a shift register.

Figure 4:
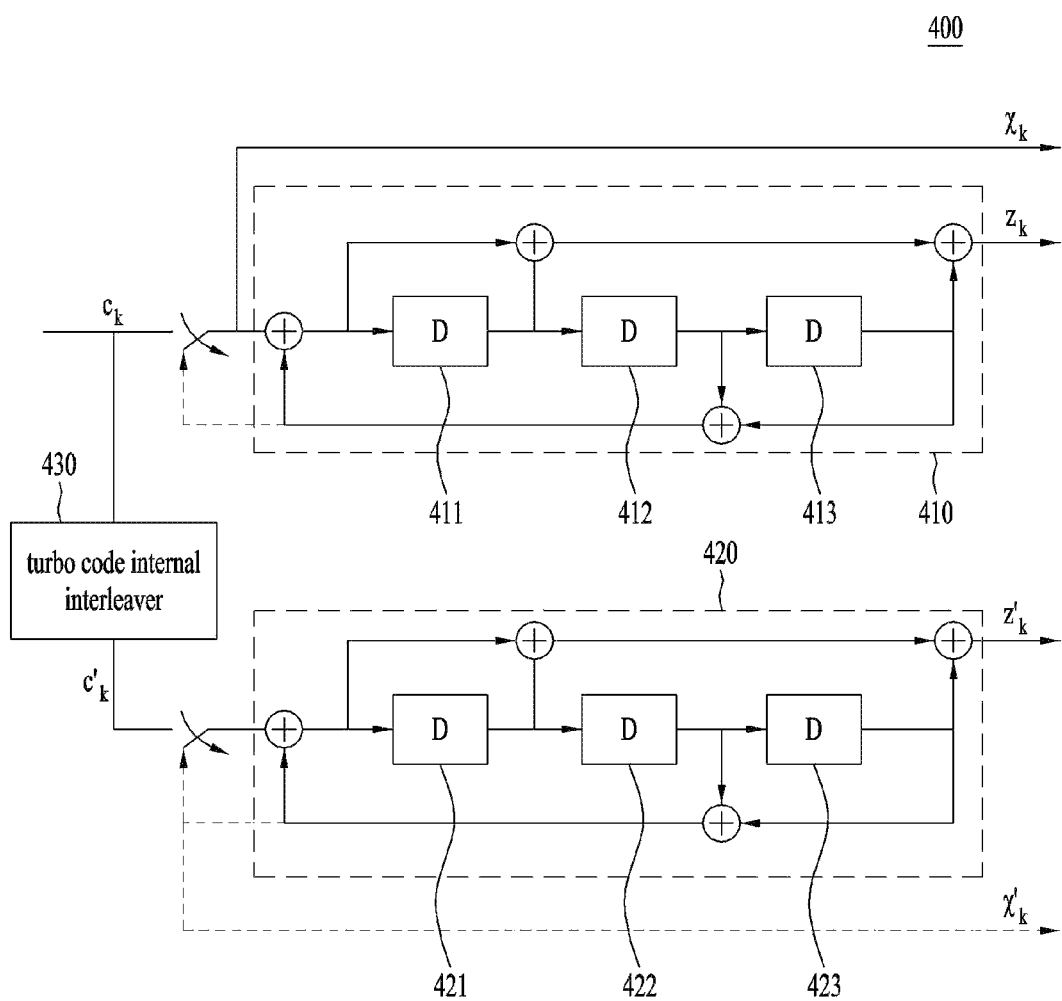
FIG. 4 illustrates a long term evolution (LTE) turbo encoder.

FIG. 4 illustrates an LTE turbo encoder.

The coding scheme of the LTE turbo encoder 400 is a parallel concatenated convolutional code (PCCC) having two 8-state constituent encoders 410 and 420 and a turbo code internal interleaver 430.

In FIG. 4, the turbo encoder 400 includes a first constituent encoder 410, a second element encoder 420, and a turbo code internal interleaver 430. The first constituent encoder 410 and the second constituent encoder 420 are 8-state constituent encoders. The first constituent encoder 410 and the second constituent encoder 420 are configured in a structure similar to that of the RSC encoder of FIG. 3. Each of the first constituent encoder 410 and the second constituent encoder 420 includes three delay units 411, 412 and 413, 421, 422 and 423.

In FIG. 4, D is a value determined according to a coding scheme and ck is an input to the turbo encoder 400. The outputs from the first constituent encoder 410 and the second constituent encoder 420 are denoted by zk and z'k, respectively. The value output from the turbo code internal interleaver 430 is denoted by c'k. Generally, the delay units 411, 412, 413, 421, 422, 423 may delay the input values by one clock. However, the delay units 411, 412, 413, 421, 422, 423 may be configured to delay the input values by more than one clock depending on the internal configuration thereof. The delay unit 411, 412, 413, 421, 422, 423 may include a shift register, delay an input bit by a predetermined clock, and then output the input bit to the next delay unit 411, 412, 413, 421, 422, 423.

The turbo code internal interleaver 430 may lower the influence of a burst error that may occur when a signal is transmitted over a radio channel. For example, the turbo code internal interleaver 430 may be a quadratic polynomial permutation (QPP) interleaver.

The turbo code is a high performance forward error correction (FEC) code and is used in the LTE communication system. For example, a data block coded by the turbo code may include three sub-blocks. One of the sub-blocks may correspond to m-bit payload data. Another subblock may be configured with n/2 bits, i.e., parity bits for the payload, calculated using a recursive systematic convolution (RSC) code. The other subblock may be configured with n/2 bits, i.e., parity bits for permutation of payload data, calculated using an RSC code. For example, the above-described permutation may be performed by an interleaver. Thus, two sub-blocks having different parity bits and the payload may constitute one block. For example, if m is equal to n/2, one block has a code rate of 1/3.

In the first constituent encoder 410, the procedure in which the input ck reaches the coded bit zk may be divided into two paths. The two paths are a first path connected from an input terminal to an output terminal without output feedback and a second path fed back from an input terminal to the input terminal.

In the first path, an input ck passed through the delay unit 411, and an input ck passed through the delay units 411, 412, and 413 are applied to the output terminal. The relationship between the input terminal and the output terminal for the first path may be expressed by a polynomial. The polynomial for the first path is called a forward generator polynomial and may be expressed as g1 in the following equation.

$$g1(D)=1+D+D^3 \quad \text{[Equation 1]}$$

In the second path, an input ck, an input ck passed through the delay units 411 and 412, and an input ck passed through the delay units 411, 412 and 413 are fed back to the input terminal. The polynomial for the second path is called a recursive generator polynomial and may be expressed as g0 in the following equation.

$$g0(D)=1+D^2+D^3 \quad \text{[Equation 2]}$$

In [Equation 1] and [Equation 2], "+" means exclusive OR (XOR), and 1 means that the input undergoes 0 delay. In addition, Dn means that the input undergoes n delays.

Figure 5:
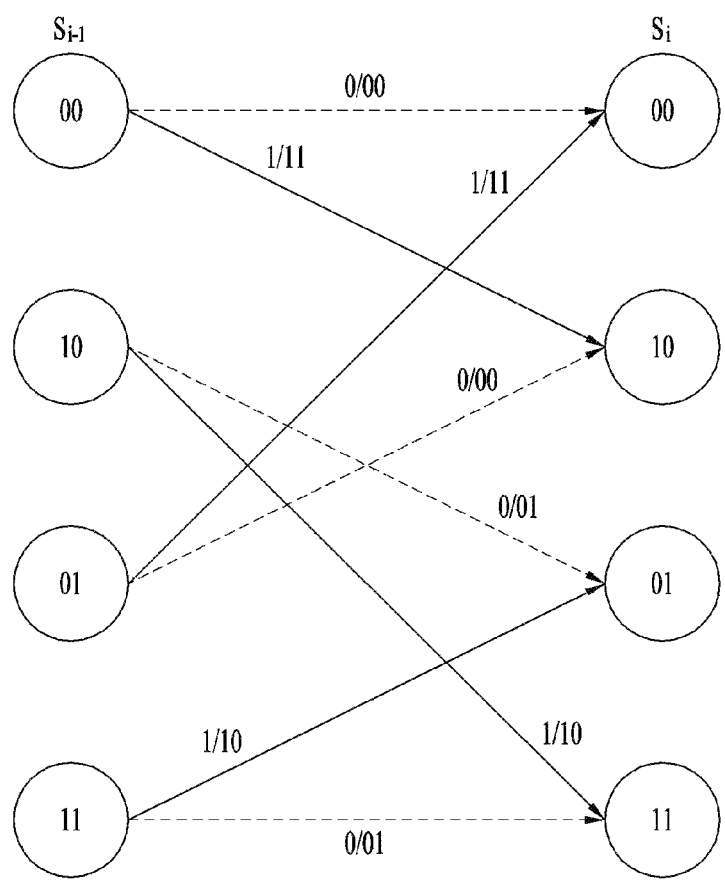
FIG. 5 illustrates an example of a trellis according to an RSC encoder.

FIG. 5 illustrates an example of a trellis according to an RSC encoder.

FIG. 5 shows the structure of the trellis of the RSC encoder shown in FIG. 3. In FIG. 5, Si denotes the state of the ith input data. In FIG. 5, each circle represents a corresponding node. In addition, a line connected between nodes represents a branch. The solid line represents a branch for the input value of 1, and the dotted line represents a branch for the input value of 0. The value on a branch is indicated by m/C1C2 (input value/systematic bit, coded bit). The trellis may also have a state that is exponentially proportional to the number of memories of the encoder. For example, if the number of memories included in the encoder is a, 2a states may be included in the trellis.

The trellis is a state machine that shows a possible state transition of an encoder between two states. A convolutional encoder such as the RSC encoder may perform coding according to a trellis diagram. The codeword coded by the RSC encoder may be decoded according to an algorithm based on the trellis structure. For example, the Viterbi or BCJR (Bahl, Cocke, Jelinek and Raviv) algorithm may be used.

Figure 6:
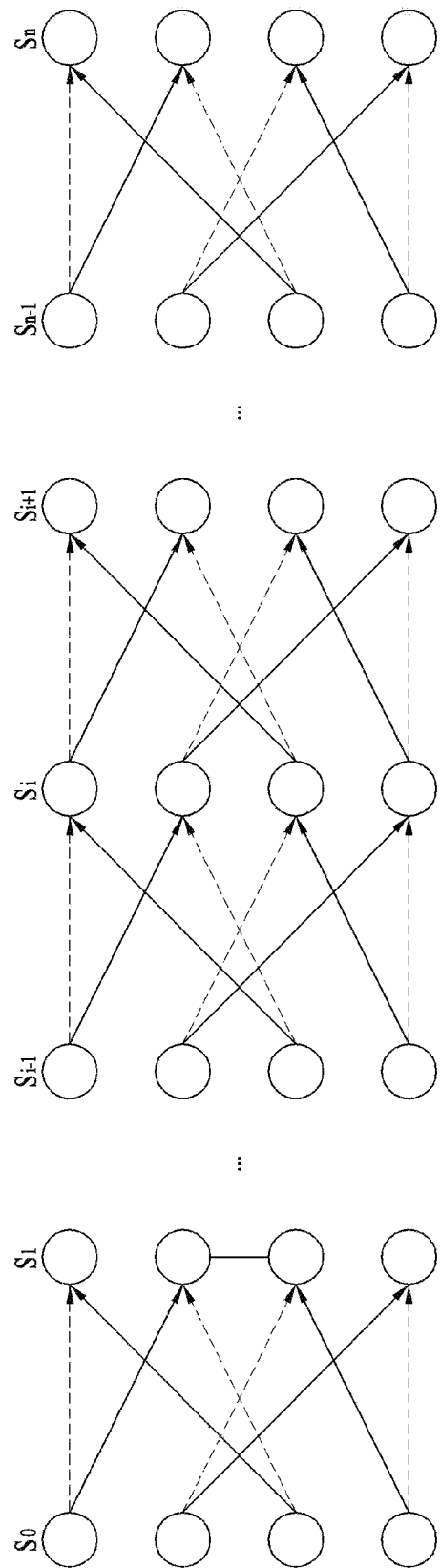
FIG. 6 illustrates an example of a trellis structure.

FIG. 6 illustrates an example of a trellis structure.

In FIG. 6, n denotes the length of a codeword. Typically, the trellis may be terminated by adding an additional bit after an input sequence. In general, a sequence configured as a sequence of 0 is referred to as a tail bit. The tail bit causes the nodes in one state of the trellis to have 0 as a value to terminate the trellis.

In FIG. 6, the length of the codeword may be determined in consideration of the length k of the input data and the length t of the tail bits. For example, if the code rate is R, the length n of the codeword may be (k+t)/R. In general, a length by which all delay units (e.g., memories) of the encoder may be reset may be determined as the length t of the tail bits. For example, the RSC encoder of FIG. 3 may use a total of 2 bits as the tail bits. The turbo encoder for LTE communication as shown in FIG. 4 may use 3 bits as the tail bits.

The length of the tail bits is shorter than the length of the input data. As described above, since the length of the codeword is associated with the length of the tail bits, loss of the code rate may occur due to the tail bits when the length of the codeword is limited. However, despite the loss of the code rate due to the tail bits, the trellis is terminated using the tail bits in many cases. This is because this method lowers computational complexity and exhibits excellent error correction performance.

The puncturing code refers to a method of puncturing a part of a codeword. In the puncturing code, a part of a codeword is punctured such that the part of the codeword is not transmitted. For example, the puncturing code may be used to lower the code rate loss caused by addition of tail bits. In this case, the receiving end may perform decoding using the trellis corresponding to the sum of the length k of the input data and the length t of the tail bits. That is, the receiving end may perform decoding on the assumption that the non-punctured codeword is received. In this case, the receiving end may consider that there is no input value for the branch from a node corresponding to the punctured bit (i.e., the bit not transmitted from the transmitting end). That is, for the branches of the node, the input data is assumed to be 0 or 1 with the same probability.

As described above with reference to FIG. 1, the CRC for a code block is added to the code block. The CRC may be determined as a remainder obtained by dividing data to be transmitted by a predetermined check value. In general, the CRC can be added to the end portion of transmitted data. The receiving end may compare the CRC with a remainder obtained by dividing received data by a predetermined check value. Alternatively, the receiving end may determine whether a remainder obtained by dividing total received data including the CRC by the check value is 0.

When a transport block size is 6144 bits, the CRC may have a maximum size of 24 bits. Thus, a code block size is determined based on the remaining bits except the CRC bits.

The receiving end may perform decoding on each code block. Thereafter, the receiving end configures a transport block based on the code block and then checks CRC for the transport block to determine whether the decoding is successfully performed. In the current LTE system, a code block CRC is used for early decoding termination. For example, if the receiving end fails to check CRC for a single code block, the receiving end may transmit NACK (Negative ACKnowledgement) to the transmitting end without decoding of remaining code blocks.

When receiving the NACK, the transmitting end may retransmit at least part of the transmitted data. For instance, the transmitting end may retransmit a transport block or at least one code block. For example, if the entirety of the transport block is retransmitted, a large amount of radio resources may be used for the retransmission. In addition, if the receiving end intends to transmit NACK due to a code block CRC failure, the receiving end may transmit information (e.g., an index of the code block) of the code block where the CRC failure occurs to the transmitting end together. Moreover, the transmitting end may retransmit the code block where the CRC failure occurs using the code block information in order to improve radio resource efficiency. However, as the number of code blocks increases, the amount of data required for feeding back information of the code blocks (e.g., code block indices) also increases.

In the LTE communication system, the receiving end uses ACK/NACK signals to inform the transmitting end whether the receiving end receives data successfully. In frequency division duplex (FDD), ACK/NACK for data received in an ith subframe is transmitted in an (i+4)th subframe. If the NACK is transmitted in the (i+4)th subframe, retransmission may be performed on an (i+8)th subframe. This is the result obtained by considering a time required for processing the transport block and a time required for generating the ACK/NACK. Specifically, a process in which a channel code for the transport block is fairly time consuming. In time division duplex (TDD), the ACK/NACK and a subframe for the retransmission may be determined based on the time required for processing the transport block, the time required for generating the ACK/NACK, and uplink subframe allocation (e.g., TDD uplink/downlink configuration). In addition, ACK/NACK bundling and multiplexing can also be used.

As described above, in the case of the turbo code, if an SNR exceeds a predetermined range, its error correction rate cannot be improved significantly. In this regard, a low-density parity-check (LDPC) code has been proposed as an alternative of the turbo code. The LDPC code, which corresponds to a linear block code, has been used in IEEE 802.11n, 802.11ac, and digital video broadcasting (DVB). The LDPC code may include a generation matrix and a parity check matrix. Data in the LDPC code may be encoded by a product of message bits and the generation matrix. In the communication standards using the LDPC code, the generation matrix may be replaced with the parity check matrix. For example, data encoding can be performed using the parity check matrix.

A linear block code can be generated based on a generation matrix G and a parity check matrix H. The linear block code is configured such that it satisfies the condition of Hct=0 with respect to every codewords c. Similar to other linear block codes, the LDPC code can be decoded by checking whether a value obtained by multiplying the parity check matrix H and the codeword c is 0. In other words, if a product (i.e., Hct) of a transposed matrix of the codeword c and the parity check matrix H is 0, it may be determined that the LDPC code is decoded.

In the case of the LDPC code, most elements of the parity check matrix are set to 0 and the number of elements that are not 0 is smaller than a code length. Thus, the LDPC code can be repeatedly decoded on the basis of probability. According to the initially proposed LDPC code, the parity check matrix is defined to have a non-systematic form and a small weight is equally applied to a row and a column of the parity check matrix. Here, the weight may mean the number of 1s included in a row or column.

As described above, the number of non-zero elements in the parity check matrix H of the LDPC code is relatively small. Thus, the LDPC code has low decoding complexity and shows performance close to Shannon's theoretical limit. Due to high error correction performance and low decoding complexity, the LDPC code is considered to be suitable for high-speed wireless communication.

Hereinafter, a structured LDPC code will be described.

Figures 7, 8:
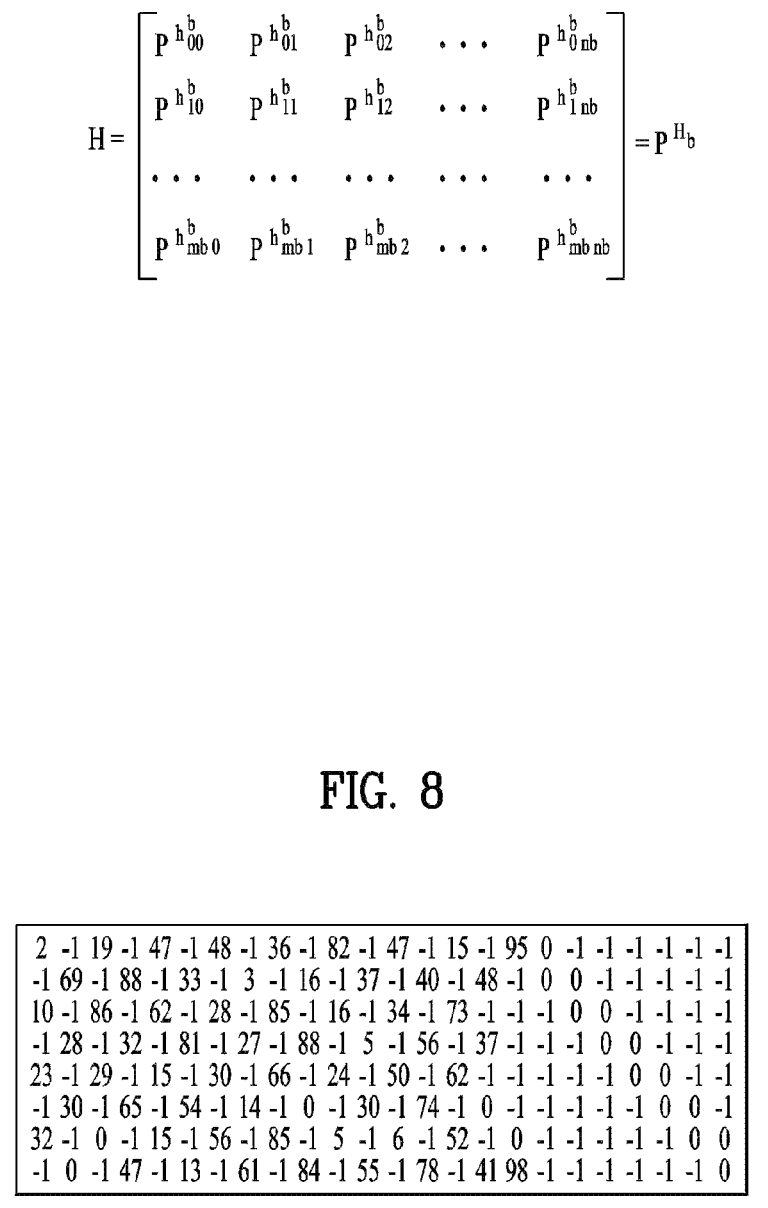

The parity check matrix H can be used to generate the LDPC code as described above. The matrix H is composed of many 0 elements and some 1 elements. The size of the matrix H may be greater than 105 bits and thus, a large memory may be required to represent the matrix H. According to the structure LDPC code, elements of the matrix H can be represented as a fixed size of sub-blocks as shown in FIG. 7. In FIG. 7, each element of the matrix H denotes a single sub-block.

According to IEEE 802.16e standard, the size of the memory for representing the matrix H can be reduced by representing the sub-block as a single integer index. In this case, each sub-block may be, for example, a permutation matrix having a fixed size.

FIG. 8 illustrates an example of a model matrix.

Specifically, FIG. 8 shows when a codeword size is 2304 and a code rate is 2/3, the model matrix used for encoding/decoding the LDPC code, which is defined in IEEE 802.16e standard. In the following description, the model matrix may mean a parity check matrix composed of at least one sub-block and each sub-block may mean a shift number. In addition, the model matrix can be extended to the parity check matrix according to a method proposed in the present invention. Therefore, encoding and decoding based on a specific model matrix may imply encoding and decoding based on the parity check matrix generated by extending the corresponding model matrix.

In FIG. 8, index '−1' indicates a predetermined size of zero matrix and index '0' indicates a predetermined size of identity matrix. In addition, positive integer indices except the indices '−1' and '0' indicate shift numbers. For example, a sub-block expressed as index '1' may mean a matrix obtained by shifting the identity matrix once in a specific direction.

Figures 9, 10:
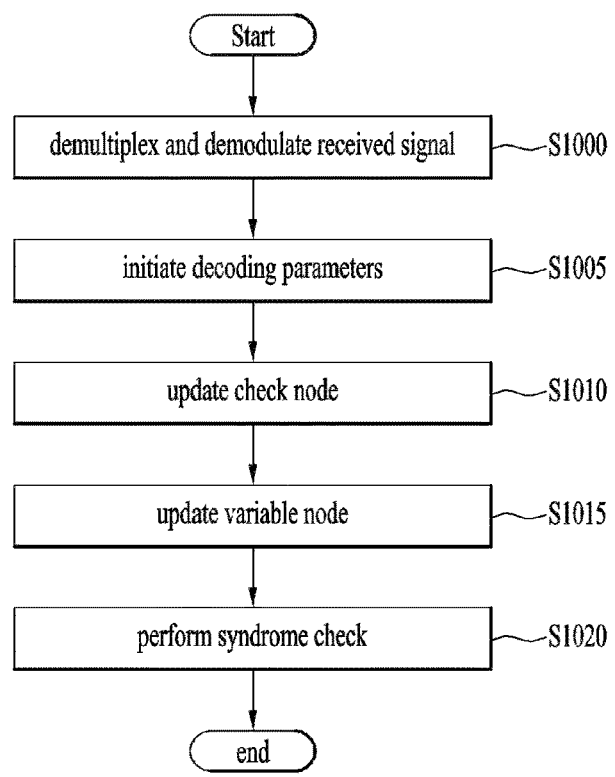
FIG. 9 is a diagram for explaining conversion of a matrix according to a shift number.
FIG. 10 is a flowchart illustrating an example of a method for decoding an LDPC code.

FIG. 9 is a diagram for explaining conversion of a matrix according to a shift number.

Specifically, FIG. 9 shows a case in which a sub-block has a size of 4 by 4. Referring to FIG. 9, the sub-block is shifted by three times to the right from with reference to the identity matrix. In this case, the sub-block of the parity check matrix of the structured LDPC code can be expressed using integer index '3'.

In general, to perform LDPC code encoding, the generation matrix G is generated from the parity check matrix H and information bits are encoded using the generation matrix G. To this end, Gaussian Reduction is performed on the parity check matrix H and then a matrix in the form of [PT:I] is generated. If the number of information bits is k and a codeword size is n, a matrix P may have k rows and (n−k) columns and a matrix I may be an identity matrix with a size of k.

If the parity check matrix has the form of [PT:I], the generation matrix G may have the form of [I:PT]. In addition, if k-bits of information is encoded, the encoded information bits may be expressed as a matrix x with a size of 1 by k. In this case, the codeword c is represented as xG and the xG has the form of [x:xP], where x corresponds to an information part (or systematic part) and xP corresponds to a parity part.

Alternatively, by designing the matrix H to have a specific structure instead of using Gaussian Reduction, the information bits can be directly encoded from the matrix H without generating the matrix G. From the structures of the matrices H and G, it can be seen that a product of the matrix G and a transposed matrix of the matrix H is 0. Based on such features and a relationship between the information bits and codeword, parity bits can be added to the end of the information bits, thereby obtaining the codeword.

FIG. 10 is a flowchart illustrating an example of a method for decoding an LDPC code.

In the communication system, while encoded data is transmitted over a radio channel, noise is included in the data. Considering this fact, the codeword c can be expressed as a codeword c' from the perspective of the receiving end. The receiving end performs demultiplexing and demodulation with respect to a received signal [S1000] and then initializes decoding parameters [S1005]. Subsequently, the receiving end updates a check node and a variable node [S1010 and S1015] and then performs a syndrome check [S1020]. That is, the receiving end can terminate a decoding procedure is terminated after checking whether c'HT is 0 or not. If the c'HT is 0, first k bits of the codeword c' can be determined as information bits x. Otherwise, if the c'HT is not 0, information bits x can be restored by finding a codeword c' that satisfies the condition of c'HT=0 based on a decoding scheme such as a sum-product.

Figure 11:
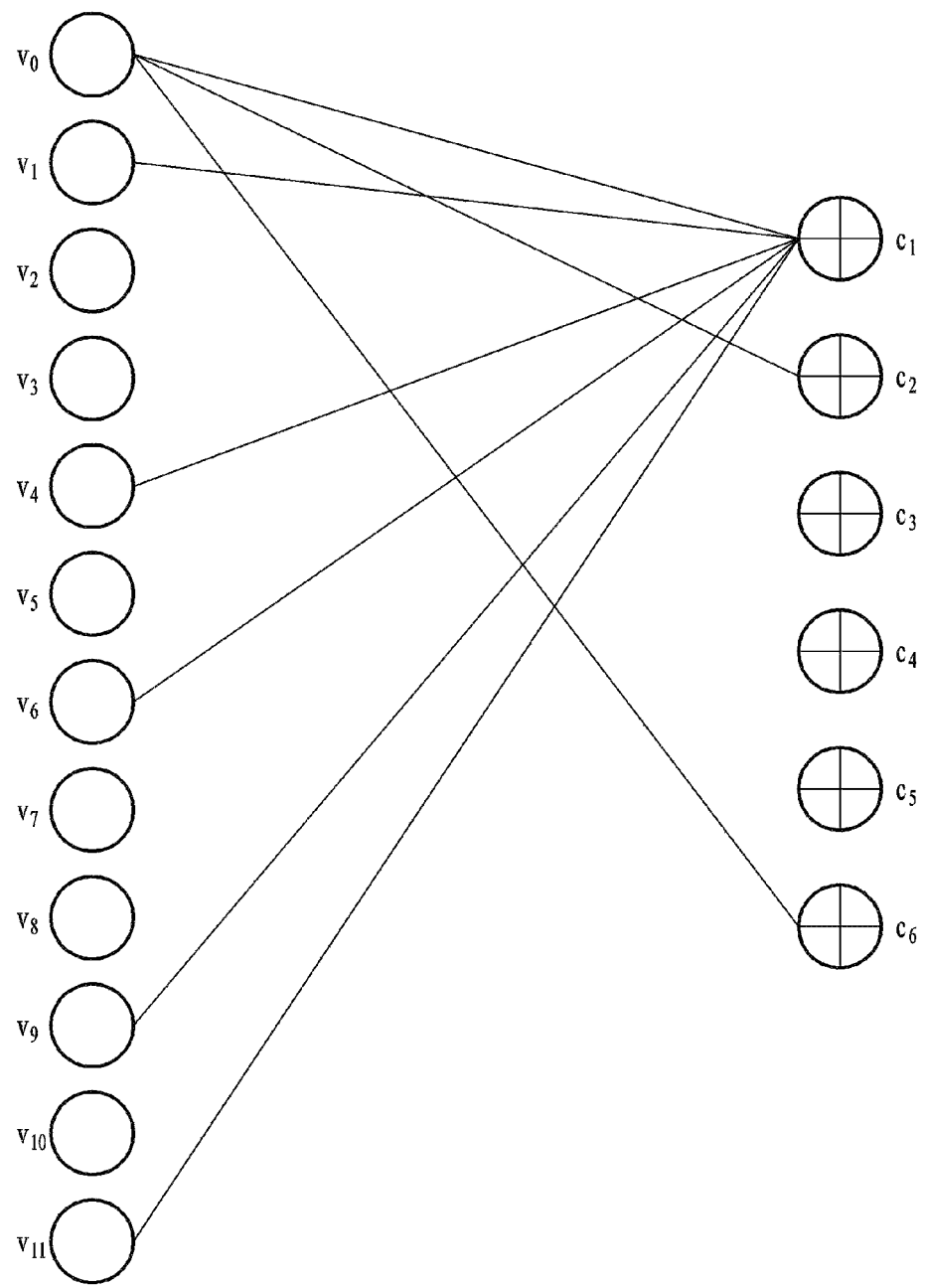
FIG. 11 illustrates an example of a bipartite graph.

FIG. 11 illustrates an example of a bipartite graph

In FIG. 11, nodes (v0, v1, . . . , v11) in the left side indicate variable nodes and nodes (c1, c2, . . . , c6) in the right side indicate check nodes. For convenience of description, FIG. 11 shows nodes connected to a variable node v0 and a check node c1. A connection line shown in the bipartite graphs of FIG. 11 can be referred to an edge. In addition, the bipartite graph of FIG. 11 may be generated from the Hct. Thus, in FIG. 11, edges from the variable node v0 may correspond to the first column of the parity check matrix H and edges from the check node c1 may correspond to the first row of the matrix H.

Since the product of the parity check matrix H and the transposed matrix of the codeword c should be 0 for successful decoding as described above, values of variable nodes connected to a single check node should also be 0. Thus, in the case of FIG. 11, the exclusive OR (XOR) of variable nodes (v0, v1, v4, v6, v9, and v11) connected to the check node c1 should be 0. That is, the syndrome check means to check whether the XOR of variable nodes connected to each check node is 0.

Hereinafter, QC (Quasi-Cyclic) LDPC code will be described.

To acquire excellent performance of the LDPC code, a parity check matrix (or generation matrix) may randomly be configured. Also, performance of the LDPC code may be improved as a block length is increased. In addition, performance of the LDPC code may be improved through an optimal decoding method in decoding. However, a belief propagation algorithm is used for decoding of the LDPC code due to decoding complexity of optimal decoding. Also, the parity check matrix of the LDPC code, which is randomly generated, has excellent performance but is complicated in its implementation and representation. Therefore, the structured LDPC code described as above is widely used. As the structured LDPC code, Quasi-Cyclic (QC) LDPC code is widely used.

The QC-LDPC code includes a Q×Q zero-matrix and a Q×Q Circulant Permutation Matrix (CPM). The Q×Q CPM is expressed as Pa and has a format (see FIG. 9) in which a Q×Q identity matrix is circular-shifted as much as a circular shifting value 'a'. For example, as shown in FIG. 7, the parity check matrix H may include (mb+1)×(nb+1) circulant permutation matrixes of amount of the identity matrix. As described above, a circular shifting value '0' denotes an identity matrix, and a circular shifting value '−1' denotes a zero (0) matrix. Also, the parity check matrix may be expressed as a matrix of circular shifting values as shown in FIG. 8. In this case, a value of each circular shifting value may be set to have a value of −1 or more and Q−1 or less. The matrix configured by the circular shifting value may be referred to as a circular shifting matrix or a characteristic matrix.

Figure 12:
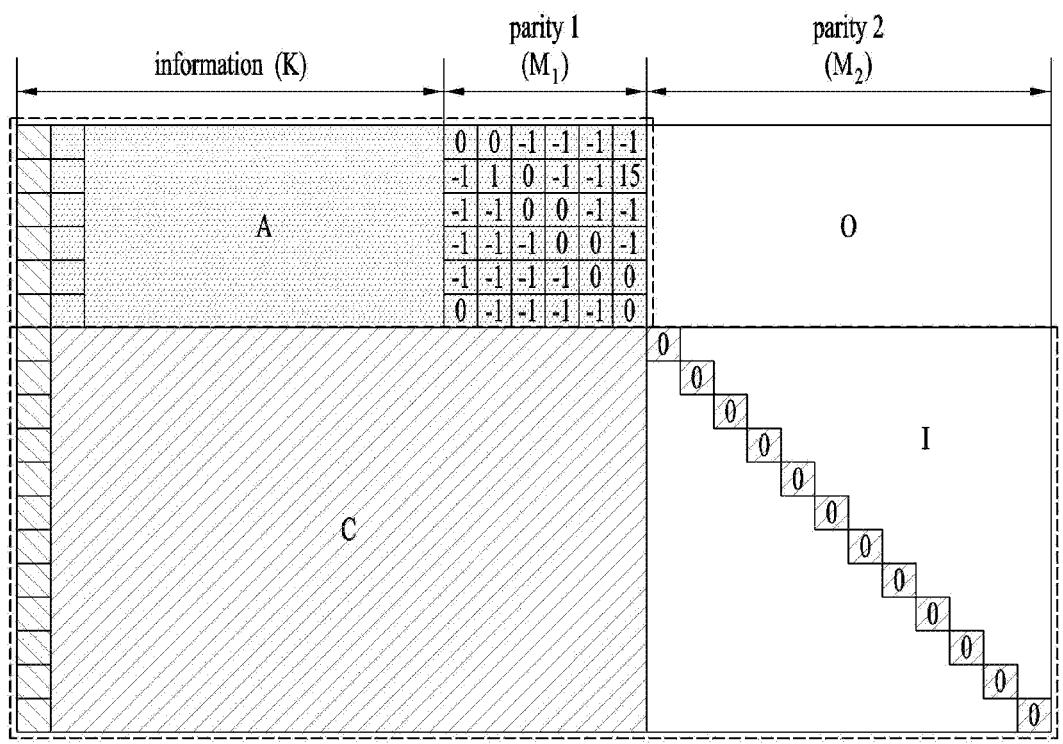
FIG. 12 illustrates a structure of LDPC code according to one embodiment.

FIG. 12 illustrates a structure of LDPC code according to one embodiment.

In the following embodiment, a multi-edge QC LDPC code may be used. For example, the multi-edge QC LDPC code may have a structure in which a high rate code similar to QC-IRA (Irregular Repeat Accumulation) and a single parity check code are concatenated as shown in FIG. 12. For example, a parity check matrix H of the multi-edge QC LDPC code may be defined as follows.

$$H = \begin{bmatrix} A & 0 \\ C & I \end{bmatrix} \qquad \text{[Equation 3]}$$

In the above equation, 'A' denotes a high rate code having a structure similar to QC-IRA. '0' denotes a zero(0) matrix. Also, C and I respectively denote information and parity of a single parity check code. In FIG. 12, 0 denotes an identity matrix, and −1 denotes a zero(0) matrix.

A lifting operation may be performed for configuration of a QC LDPC code of a desired size. Lifting is used to acquire a parity check matrix of a desired size from a preset parity check matrix. Various code lengths may be supported by change of a lifting size. For example, floor lifting or modulo lifting may be used. For example, a parity check matrix according to modulo lifting may be acquired as follows.

$$H_Q = \begin{cases} a_{ij} \text{MOD } Q & \text{if } a_{ij} \neq -1 \\ -1 & \text{if } a_{ij} = -1 \end{cases} \qquad \text{[Equation 4]}$$

In the above equation, Q denotes a lifting size. Also, aij denotes a shift value of row i and column j of the preset parity check matrix (see FIG. 8). Also, MOD Q denotes modulo computation based on a value of Q. That is, in the circular shifting matrix of the preset parity check matrix, values corresponding to the zero(0) matrix are maintained, and modulo computation based on a lifting size Q is performed for the other circular shifting values. Therefore, shift values of the circular shifting matrix are shifted to values of −1 or more and Q−1 or less.

Figure 13:
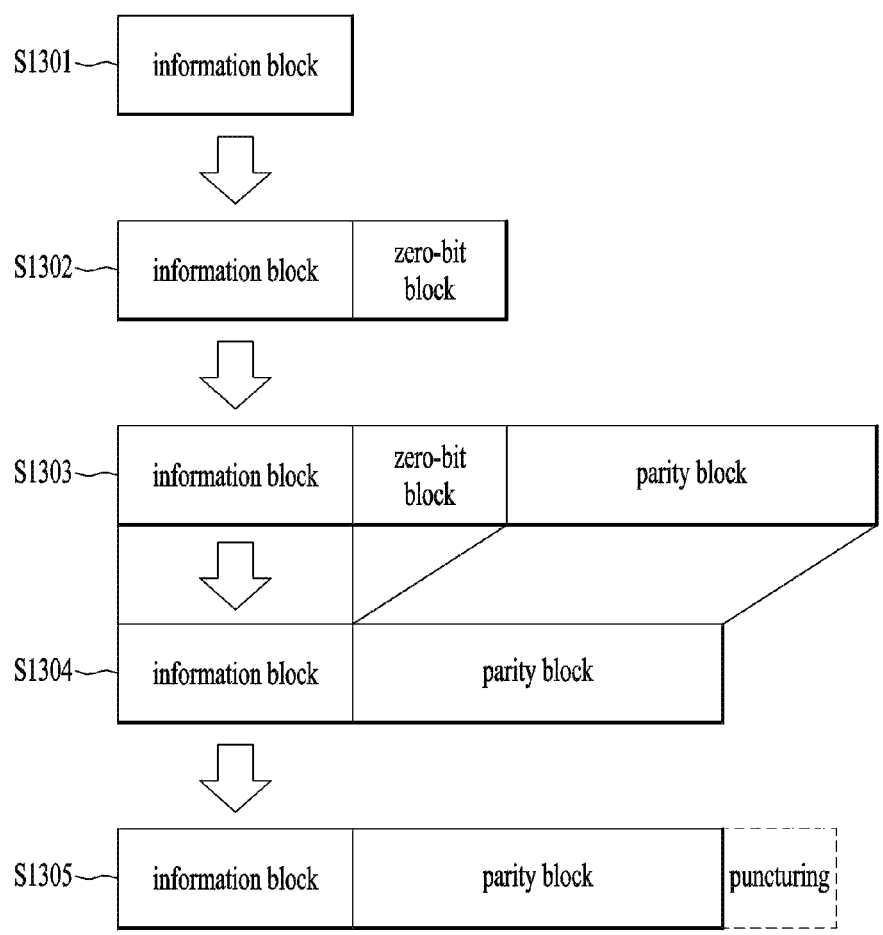
FIG. 13 is a conceptual view illustrating rate matching according to one embodiment.

FIG. 13 is a conceptual view illustrating rate matching according to one embodiment.

A length of data bits which can be transmitted substantially may be determined based on a size of an available physical resource. Therefore, a codeword having a code rate corresponding to a size of an available physical resource may be generated. For example, a shortening scheme or a puncturing scheme may be used for rate matching. The shortening scheme may be performed by partially removing an information part of a codeword, for example. Since information bits are partially reduced, a code rate may be reduced by the shortening scheme. The puncturing scheme may be performed by puncturing at least a part of parity of a codeword, for example. Since a rate of information bits is increased in case of puncturing, a code rate may be increased. Therefore, a codeword corresponding to a random code rate may be generated by combination of shortening and puncturing.

Performance of shortening and puncturing may be determined in accordance with the order of bits subjected to shortening or puncturing. However, in case of the QC LDPC code, the puncturing order of bits within Q×Q unit block does not affect performance Therefore, after interleaving in a unit of a lifting size Q is performed for a parity block, puncturing may be performed from the last part of the parity bits. Also, shortening may be performed from the last part of the information bits.

Meanwhile, if a size of a physical resource is greater than a length of a coded LDPC code, rate matching may be performed through a repetition scheme.

Referring to FIG. 13, an information block which includes information bits to be transmitted is generated (S1301). If a size of a code block is smaller than a length of an LDPC information part, zero(0)-bit information may be added to the rear of the information block before encoding. In the example of FIG. 13, for later shortening, the zero-bit block is inserted to the rear of the information block (S1302). Afterwards, encoding based on the LDPC code may be performed for the information block and the zero-bit block, whereby a codeword including a parity block may be generated (S1303). In step S1303, the information block and the zero-bit block may correspond to the information part of the LDPC code, and the parity block may correspond to the parity part of the LDPC code.

As described above, the shortening scheme may be applied for rate matching. In this case, the zero-bit block which is previously inserted may be removed (S1304). Also, for puncturing which will be described later, interleaving (or permutation) in a unit of a lifting size may be performed for the parity block. Also, for rate matching, the last part of the parity block may be punctured (S1305).

Figure 14:
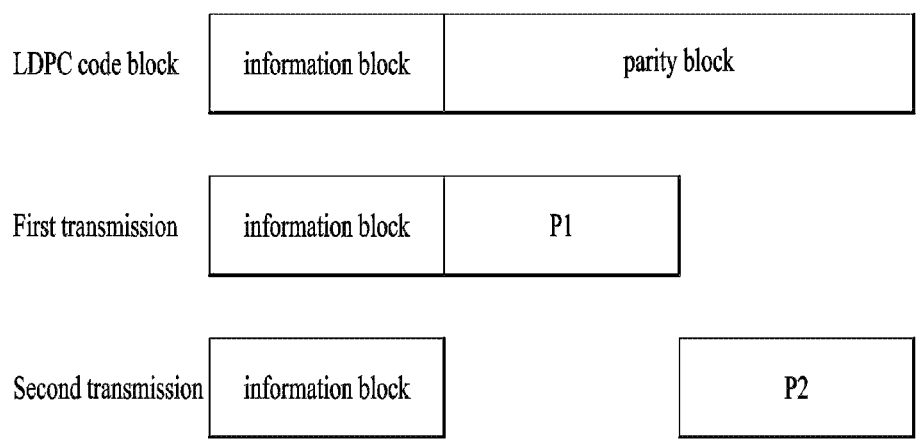
FIG. 14 is a conceptual view illustrating incremental redundancy retransmission according to one embodiment.

FIG. 14 is a conceptual view illustrating incremental redundancy retransmission according to one embodiment.

A circular buffer may be used for rate matching. For example, in the LTE turbo code, data are recorded in the circular buffer in the order of systematic bits-parity bits. For example, in the LTE turbo code, four redundancy versions may be configured for the circular buffer. HARQ (Hybrid Automatic Repeat reQuest is an error correction mechanism in the LTE. A transmitted packet is received in a receiving end after certain delay. The receiving end generates ACK or NACK and transmits the generated ACK or NACK to a transmitting end. If NACK is transmitted, a requested packet is retransmitted. If NACK is received, the transmitting end may transmit bits read based on a position of the redundancy version every transmission. For example, redundancy version 0 may indicate a start position of the circular buffer. Also, redundancy versions 1, 2 and 3 may indicate the position of the circular buffer subsequent to the redundancy version 0. The redundancy version are gradually increased during retransmission. Therefore, as retransmission is performed, systematic bits within retransmission are reduced and parity bits are increased.

It may be required to transmit many bits, if possible, for retransmission to maximize gain of Incremental Redundancy (IR). For example, since coding gain is greater than repetition gain, punctured parity bits may be retransmitted, whereby IR gain may be maximized. For example, if there is no parity to be additionally transmitted for HARQ retransmission, information bits and/or parity bits transmitted during prior transmission may be retransmitted.

Referring to FIG. 14, an information block and a parity block P1 which is partially punctured are transmitted during first transmission. Afterwards, a punctured parity block P2 and at least a part of the information block may be transmitted during second transmission (retransmission). That is, since a size of the punctured parity block P2 is smaller than that of a resource for retransmission, the puncture parity block P2 may be transmitted together with a portion of the information block transmitted during previous transmission. For example, high rate data may be transmitted through puncturing during the first transmission. For example, if the receiving end fails in decoding, data having a lower rate may be retransmitted during retransmission, whereby decoding may be attempted.

Figure 15:
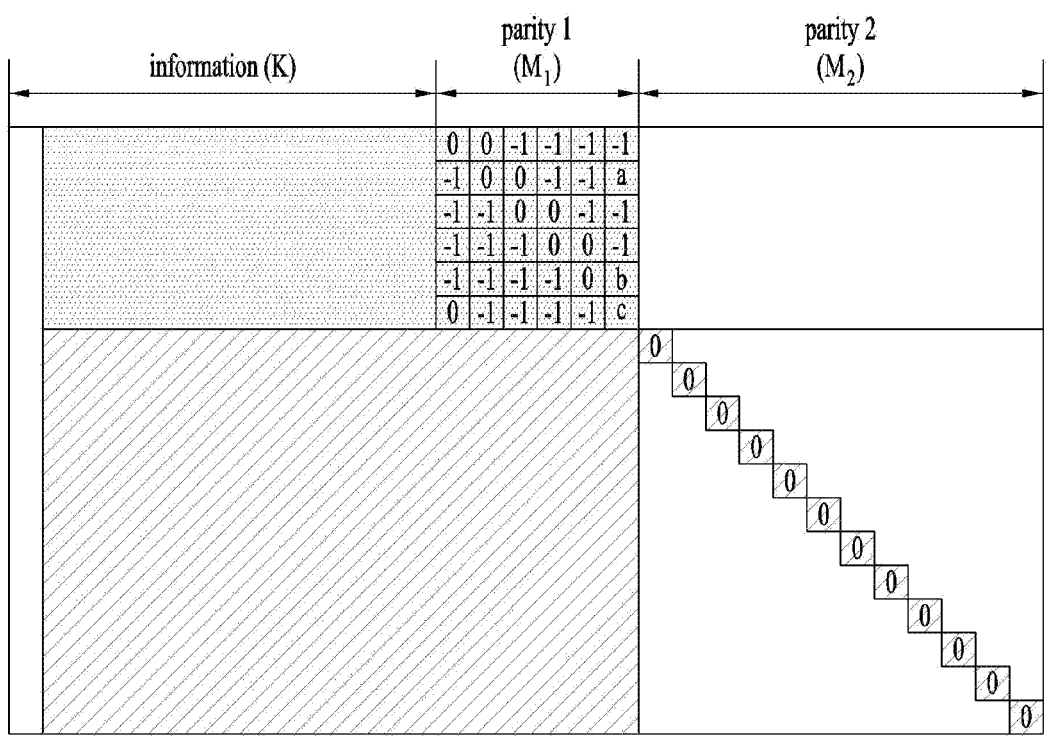
FIG. 15 is a structural view illustrating a code block of LDPC code.

FIG. 15 is a structural view illustrating a code block of LDPC code.

In FIG. 15, an information part and a parity part 1 may be expressed like $H_a$ below $$H_a = [H_1 H_2] \quad \text{[Equation 5]}$$

In the above equation, $H_1$ denotes the information part, and $H_2$ denotes the parity part. In this case, a coded message m may be expressed as $\{m(0), m(1), \ldots, m(K-1)\}$.

$$H_1 \cdot m^T = \{a_0, a_1, \ldots, a_{M_1-1}\}^T$$

$$a_i = H_1(i) \cdot m^T = \Sigma_{j=0}^{K-1} m^T(j) \quad \text{[Equation 6]}$$

In the above equation, $H_1(i, j)$ denotes Q×Q sub-matrix corresponding to row i and column j of $H_1$. Also, m(j) denotes the jth 1×Q sub-sequence of the information bits. Also, K denotes the number of Q-unit rows of $H_1$. Also, $M_1$ denotes the number of Q-unit rows of $H_2$. Parity 1 may be expressed as $\{p(0), p(1), \ldots, p(M1-1)\}$. In this case, p(i) denotes the ith 1×Q sub-sequence of parity 1.

In FIG. 15, a, b, and c of parity 1 denote random circular values. Two values of the circular values 'a', 'b', and 'c' in degree-3 column of $H_2$ are set to the same values. For example, 'b' and 'c' may be equal to each other, and 'a' may be set to a value different from 'b' and 'c'.

$$p_a(M_1-1) = \Sigma_{i=0}^{M_1-1} a_i^T \quad \text{[Equation 7]}$$

In the above equation, $p_a(M1-1)$ means that $p(M1-1)$ is right circular shifted as much as 'a'. $p(M1-1)$ may be calculated from the above equation 7 due to a parity structure similar to QC-IRA and degree-3 variable nodes.

For example, if 'a' and 'b' are equal to each other and 'c' is set to a value different from 'a' and 'b', the following equation may be used.

$$p_c(M_1-1) = \Sigma_{i=0}^{M_1-1} a_i^T \quad \text{[Equation 8]}$$

Also, if 'a' and 'c' are equal to each other and 'b' is set to a value different from 'a' and 'c', the following equation may be used.

$$p_b(M_1-1) = \Sigma_{i=0}^{M_1-1} a_i^T \quad \text{[Equation 9]}$$

The other parts may be calculated in a backward or forward direction based on dual diagonal characteristics of parity. For example, parity 1 may be calculated in accordance with the following equation.

$$p(4) = p_b(5) + \alpha_4^T$$

$$p(3) = p(4) + \alpha_3^T$$

$$p(2) = p(3) + \alpha_2^T$$

$$p(1) = p_a(5) + p(2) + \alpha_1^T$$

$$p(0) = p(1) + \alpha_0^T \quad \text{[Equation 10]}$$

As expressed in the above equation, p(1) may be calculated from p(M1-1). A finally coded codeword $C_0$ may be comprised of $\{m(0), m(1), \ldots, m(K-1), p(0), p(1), \ldots, p(M1-1)\}$.

Therefore, for coding of the LDPC code, the above equation 6 may be calculated using the information bits and $H_1$, and 1×Q sequence having a column degree 3 of parity 1 may be calculated using the above equation 7, 8, or 9. Also, sub-sequences of the other parities may be calculated from the result of the above equation 7, 8, or 9 in accordance with the above equation 10. Meanwhile, the above equation 10 may be changed in accordance with a position of 'a'. Also, in this case, concatenation with $p(M_1-1)$ should be considered for a part (p(1) in the equation 10) having a degree 3 in a row direction.

Hereinafter, a method for generating parity 2 will be described. Parity 2 $P_2$ may be expressed as $\{q(0), q(1), \ldots, q(M2-1)\}$. In this case, $q(i)$ denotes a $1 \times Q$ sub-sequence of the ith column of parity 2.

$$H_c \cdot C_0^T = \{\beta_0, \beta_1, \ldots, \beta_{M2-1}\}^T$$

$$\beta_i = H_c(i) \cdot C_0^T = \Sigma_{j=0}^{L-1} C_0^T(j) \quad \text{[Equation 11]}$$

In the above equation, $H_c(i, j)$ denotes a $Q \times Q$ sub-matrix of an ith row and a jth column in an information part of a single parity check matrix. $C_0(j)$ denotes the jth $1 \times Q$ sub-sequence of the aforementioned encoded codeword. Also, L denotes the number of Q-unit columns of $H_c$. Also, $M_2$ denotes the number of Q-unit columns of a parity part of a single parity check code. Each sub-sequence of parity 2 may be calculated in accordance with the following equation.

$$q(i) = \beta_i^T \quad \text{[Equation 12]}$$

Therefore, a final codeword $C_1$ coded in accordance with the single parity check matrix may be expressed as $\{c0, c1, cL-1, q(0), q(1), \ldots, q(M2-1)\}$.

As described above, a lifting operation may be used to code information blocks of various lengths. However, if the information blocks of various lengths are coded by only a parity check matrix lifted by a single Q value, high performance deviation occurs between the code blocks coded for an information block of a long length and an information block of a short length. Therefore, to reduce performance deviation, a plurality of parity check matrixes lifted by various Q values may be used. In this case, selection and rate matching of parity check matrixes according to the sizes of the information blocks may be performed in accordance with the embodiments which will be described later.

Figure 16:
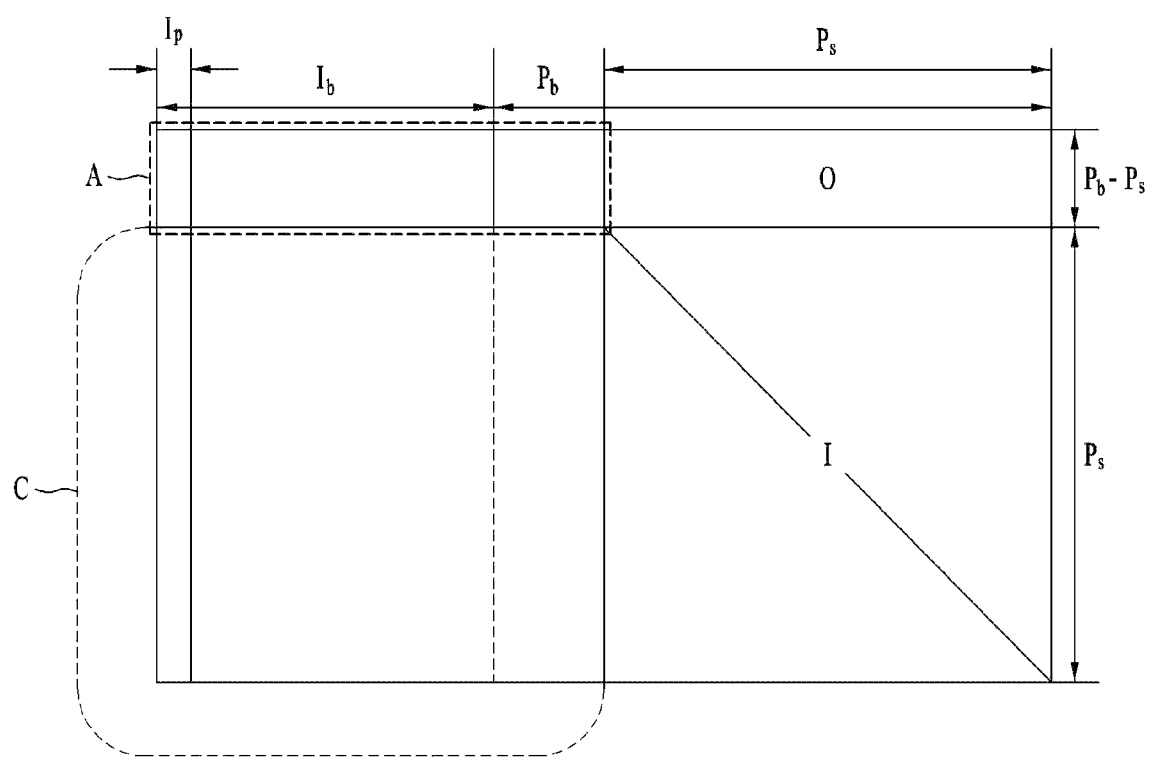
FIG. 16 illustrates a characteristic matrix according to one embodiment.

FIG. 16 illustrates a characteristic matrix according to one embodiment.

Description of each of parts A, O, C, and I in a characteristic matrix may be understood with reference to the description made with reference to FIG. 12. FIG. 15 illustrates a parity check matrix lifted by a random Q value. Therefore, K, $M_1$, and $M_2$ of FIG. 15 are configured by an integer multiple of the Q value. Also, Ib, Pb, and Ps correspond to K/Q, $M_1$/Q, and $M_2$/Q of FIG. 15, respectively.

For example, N Q values may be supported by the parity check matrix. In this case, a set $\Phi$ of the Q values may be defined by a set having N elements $Z_i$ (i is an integer of 0 or more and N−1 or less). For example, $Z_{N-1}$ in the set $\Phi$ may have the greatest value. Also, $Z_i \times Z_i$ sized CPM may be generated by scaling $Z_{N-1} \times Z_{N-1}$ sized CPM. For example, as described above, modulo computation based on the value of $Z_i$ may be performed for the $Z_i \times Z_i$ sized CPM, whereby the $Z_i \times Z_i$ sized CPM may be generated.

For example, a size of an information block or divided information block may be K. Also, a target code rate may be set to R, or a length of the target code block may be set to $N_{code}$. In this case, the following methods may be used for rate matching.

The LDPC code has unequal protection characteristics of which performance is varied depending on the position in the code block. This is because that information bits are arranged at the front of the LDPC code block and parity bits are arranged at the rear of the LDPC code block. Therefore, shortening for the information part on the code block may be minimized to maximize error correction performance.

First of all, the lifting size $Z_i$ may be selected as a minimum value within the set $\Phi$ which satisfies $Z_i \times I_b \geq K$. Hereinafter, the lifting value which satisfies the above condition is expressed as $Z_n$. In this embodiment, the value of Ib may be preset between the receiving end and the transmitting end. Also, the value of K may be preset between the transmitting end and the receiving end, or may be indicated to the receiving end by the transmitting end. For example, the value of K may be transmitted through uplink control information (UCI) or downlink control information (DCI). Also, the value of K may be transmitted through higher layer signaling.

The characteristic matrix may be lifted using the selected value of $Z_n$, whereby the $Z_n \times Z_n$ sized parity check matrix may be generated. As described above regarding the shortening scheme, zero-bit block (or known bit block) having a length of $N_{short}$ may be added to the information block of the length K. In this case, the length $N_{short}$ of the zero-bit block (or known bit block) is equal to $I_b \times Z_n - K$. As described above, $Z_n$ is a minimum value which satisfies the aforementioned condition within the set $\Phi$. Therefore, $N_{short}$ has a minimum value of a shortening length which may be generated from $Z_i$ within the set $\Phi$.

As described above, the first information block and the first parity block are generated in accordance with the LDPC code encoding. After LDPC code encoding, the length $N_{short}$ part corresponding to the zero-bit block (or known bit block) is removed from the first information block, whereby the first information block which is shortened is generated. For example, the last part of the first information block may be shortened. In this case, the first information block which is shortened has a size of $I_b \times Z_n$, and the first parity block has a size of $P_b \times Z_n$. After shortening, the first information block and the first parity block, which are shortened, are input to the circular buffer.

Therefore, the size of the code block may be expressed by the following equation 13 or 14.

$$(I_b - I_p + P_b) \times Z_n \quad \text{[Equation 13]}$$

$$K - I_p \times Z_n + P_b \times Z_n \quad \text{[Equation 14]}$$

In the above equations 13 and 14, $I_p$ denotes a length of a punctured part in the information block. For example, in a specific LDPC code, the information block may partially be punctured, whereby performance may be improved. However, if this puncturing is not used, $I_p$ may be set to 0. On the other hand, if this puncturing is used, the part equivalent to $I_p \times Z_n$ from the first information block may not be input to the circular buffer.

Data equivalent to the size $N_{code}$ of the target code block may sequentially be output from the circular buffer. In this case, $N_{code}$ has a value equal to or similar to K/R. The circular buffer may sequentially output data from random offset. For example, offset may correspond to each redundancy version. For example, the circular buffer may output data in the ascending order from the redundancy version 0. Also, the circular buffer may output data cyclically. For example, if all data of the circular buffer are output, the data may be output sequentially from the first part (for example, start offset) until the size of the output data corresponds to $N_{code}$.

Also, parities of the code block may partially be punctured for rate matching as described above. For example, puncturing may be performed from the last part or the least significant bit (LSB) of the code block. Also, for example, the punctured parity part may be transmitted during retransmission to maximize coding gain.

Figure 17:
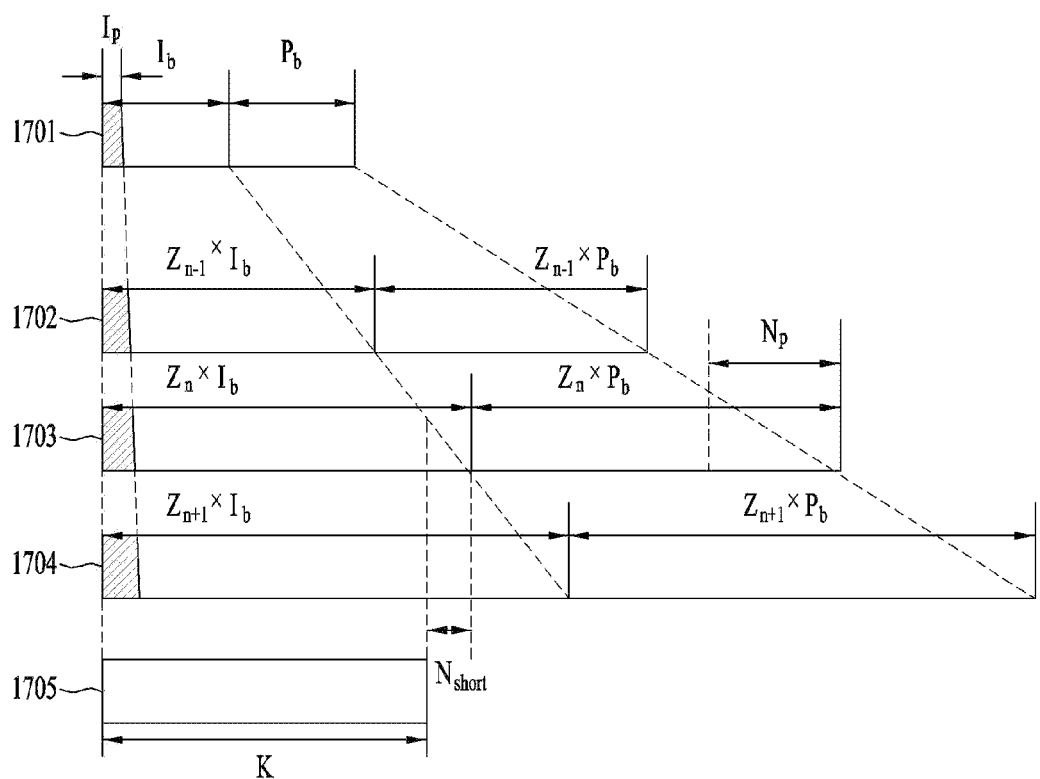
FIG. 17 is a conceptual view of selection of a lifting value according to one embodiment.

FIG. 17 is a conceptual view of selection of a lifting value according to one embodiment.

In FIG. 17, a first code block 1701 has a size which may be generated by a base matrix for which lifting is not performed. In this case, the size of the information block is $I_b$, and the size of the parity block is $P_b$. $I_p$ is a size of the information block which is punctured, if the information block is partially punctured. A size of an information block 1705 to be coed is set to K. In FIG. 17, a second code block 1702 is a code block generated by a circulant permutation matrix lifted by a lifting value $Z_{n-1}$, a third code block 1703 is a code block generated by a circulant permutation matrix lifted by a lifting value $Z_n$, and a fourth code block 1704 is a code block generated by a circulant permutation matrix lifted by a lifting value $Z_{n+1}$. As described above, the lifting value may be set to a minimum value of lifting values of which lifted circular permutation matrix has a length longer than a length of information bits. As shown in FIG. 17, the information part of the second code block 1702 is shorter than the length K of the information block 1705. Also, the information parts of the third code block 1703 and the fourth code block 1704 are longer than the length K of the information block 1705. However, since the lifting value $Z_n$ of the third code block 1703 is smaller than $Z_{n+1}$, $Z_n$ may be selected as a lifting value in this embodiment.

As shown in FIG. 17, after encoding, the third code block 1703 may partially be shortened. For example, the third code block 1703 which exceeds the length K of the information block 1705 may be shortened as much as $N_{short}$. In this case, as described above, the zero-bit block or a block of a preset bit may be added to the information block 1705 before encoding. Also, the parity block may partially be punctured for rate matching or matching with the length of the target code block. For example, in FIG. 17, the parity block of the third code block 1704 may partially be punctured as much as $N_p$.

For example, if the length of the target code block is very greater than the code block input to the circular buffer or a code rate is very low, the code block input to the circular buffer is retransmitted repeatedly. Therefore, although power gain occurs due to retransmission of data which are already transmitted, since the same data are retransmitted, coding gain cannot be acquired. Therefore, in selection of the aforementioned lifting size, a lifting value which can maximize coding gain may be selected.

HARQ operation may be configured such that the first transmission may have the highest code rate. The information block is arranged at the front of the LDPC code block, and the parity block is arranged at the front of the LDPC code block. Also, since the circular buffer outputs data sequentially from the front side, it is likely that many information blocks are included in the first transmission and the amount of the parity blocks is increased in retransmission. Therefore, the first transmission may have a high code rate.

In retransmission operation, final error correction performance after retransmission is more important than error correction performance in the first transmission. However, as the code rate is lowered, coding gain is reduced. Therefore, although power gain may be acquired through retransmission of low data having a low code rate, it is difficult to expect coding gain. Therefore, the size of the target code block or a target code rate may be set such that coding gain may be maximized.

For example, the size of the information block to be encoded may be set to K. Also, the length of the target codeword may be set to $N_{code}$. In this case, the lifting value $Z_n$ selected from the set Φ of the lifting values may be Zi of the minimum value which satisfies the following equation.

$$Z_i \geq \frac{(N_{code} - K)}{P_b - I_p} \qquad \text{[Equation 15]}$$

In the above equation, $P_b$ denotes a length of the parity block of the encoded code block, and $I_p$ denotes a length of a part punctured from the information bit. If puncturing for the information block is not applied, $I_p$ may be set to 0. Also, in the aforementioned method, since the length K of the information bit is determined, the lifting value may be selected based on the target code rate R instead of the length $N_{code}$ of the target code block.

That is, $Z_n$ is set such that the length of the code block coded by the parity check matrix is longer than the target codeword length $N_{code}$. Therefore, the length of the entire code blocks may not be transmitted by transmission of one time. In this case, at least a part of the parity may not be transmitted. Therefore, the parity which is not transmitted during previous transmission may be transmitted by retransmission of at least one time. Therefore, coding gain according to retransmission may be acquired.

Also, the lifting value may be determined based on a target incremental redundancy parameter. For example, positions of a plurality of redundancy versions may be set within the circular buffer. Also, data within the circular buffer may be transmitted from the position where the redundancy versions are increased in accordance with repetition of transmission. Therefore, how many transmission times are performed to transmit entire data may be determined through the target incremental redundancy parameter. For example, the redundancy versions may be set to 0, 1, and 2. For example, the information block and some parity blocks may be transmitted from the redundancy version 0 during the first transmission. Also, some parity blocks which are not transmitted from the redundancy version 1 may be transmitted during the second transmission, and the other some parity blocks which are not transmitted from the redundancy version 2 may be transmitted during the third transmission. Also, for example, the third transmission from the redundancy version 2 may further include a part of the information block. Therefore, in this case, the entire code blocks are transmitted through the third transmission. The transmitting end may notify the receiving end of retransmission times required for transmission of the entire code blocks. For example, the transmitting end may notify the receiving end of transmission times for transmission of the entire code blocks, retransmission times or redundancy version.

In this embodiment, the other steps except selection of the lifting value may be equal to the aforementioned rate matching method. However, in this embodiment, the lifting value is determined based on the target incremental redundancy parameter, the length of the target code block, or the target code rate, in addition to the length of the information bit. Therefore, the transmitting end may notify the receiving end of the length (or code rate) of the code block together with the length of the information bit. Also, the transmitting end may notify the receiving end of the length of the information bit and the selected lifting size. For example, the aforementioned information may be transmitted through uplink control information or downlink control information.

FIG. 18 illustrates a characteristic matrix of a high rate code according to one embodiment.

For example, the parity check matrix according to one embodiment may be configured in the form of the above equation 3. In this case, parts corresponding to Q columns of a matrix A and a matrix C may be punctured to improve performance. These punctured parts may not be transmitted. Q denotes a lifting value. The parity check matrix in the above equation 3 may be expressed as a characteristic matrix below.

$$C_H = \begin{bmatrix} C_A & C_O \\ C_C & C_I \end{bmatrix}$$ [Equation 16]

In the above equation 16, CA, CC, CO, and CI respectively denote characteristic matrixes of matrixes A, C, O, and I in the equation 3. Also, for example, the lifting size Q for each code length may be supported as follows.

TABLE 1

| | Code length | | | | |
|---|---|---|---|---|---|
| | 8000 | 6000 | 4000 | 2000 | 1000 |
| Lifting value (Q) | 320 | 240 | 160 | 80 | 40 |

A characteristic matrix of a high rate code corresponding to a lifting value of 320 is shown in FIG. 18. Therefore, as described above, elements of the characteristic matrix of the high rate code may have sizes from −1 to 319. In FIG. 18, −1 denotes a zero matrix, and 1 denotes an identity matrix. Also, as described above, characteristic matrixes corresponding to lifting values of different sizes may be generated by performing scaling for a characteristic matrix corresponding to the greatest lifting value. For example, a characteristic matrix of a desired size may be generated based on modulo computation as expressed in the above equation 4. In the characteristic matrix of FIG. 18, two identity matrixes are arranged at the last part in a diagonal form. That is, a dual diagonal type is included in the characteristic matrix.

Figure 19:
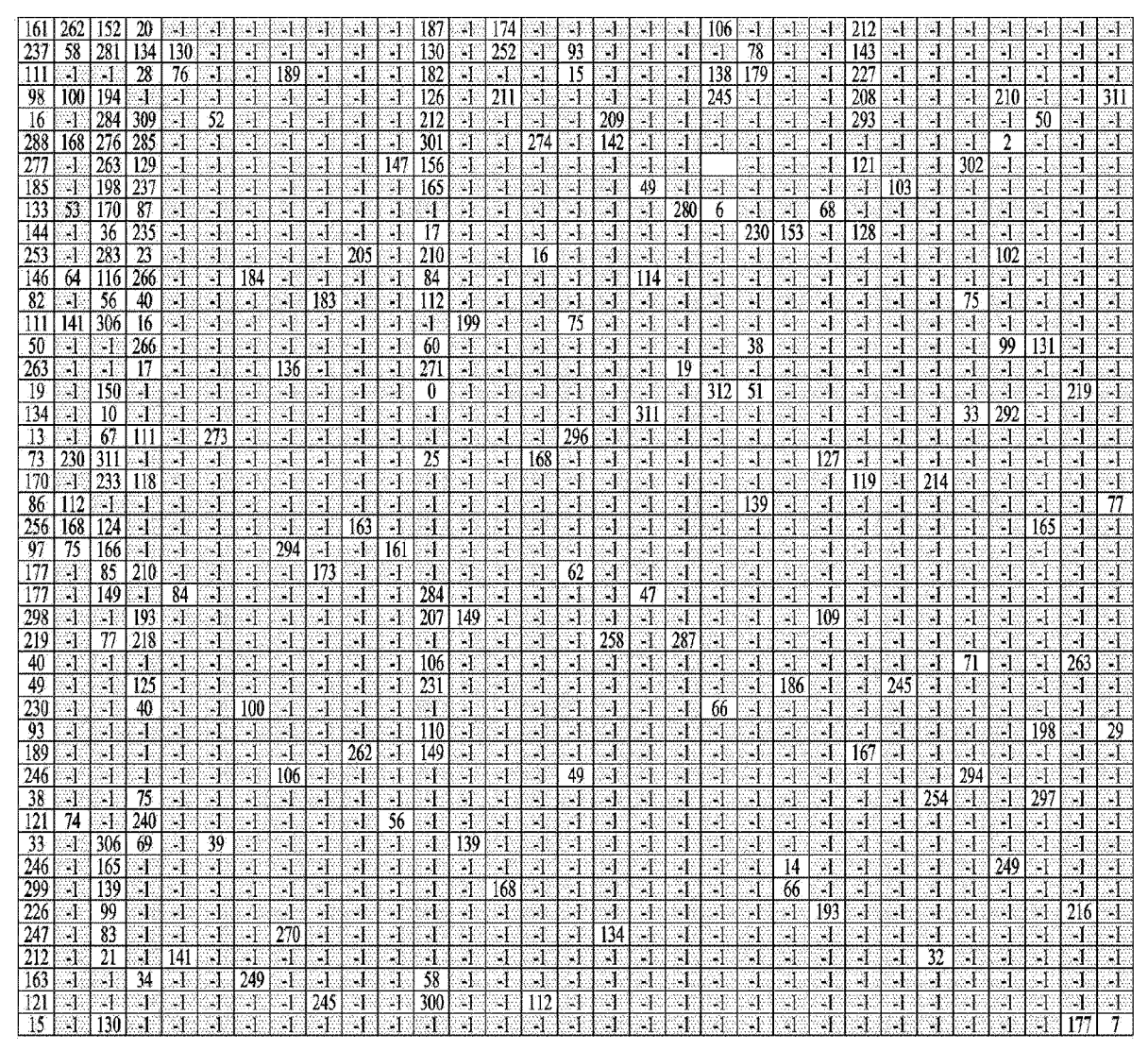

FIG. 19 illustrates a characteristic matrix of an information part of a single parity check code according to one embodiment.

FIG. 19 illustrates an information part of a single parity check code corresponding to a lifting value 320. In FIG. 19, −1 denotes a zero matrix, and 1 denotes an identity matrix.

Figure 20:
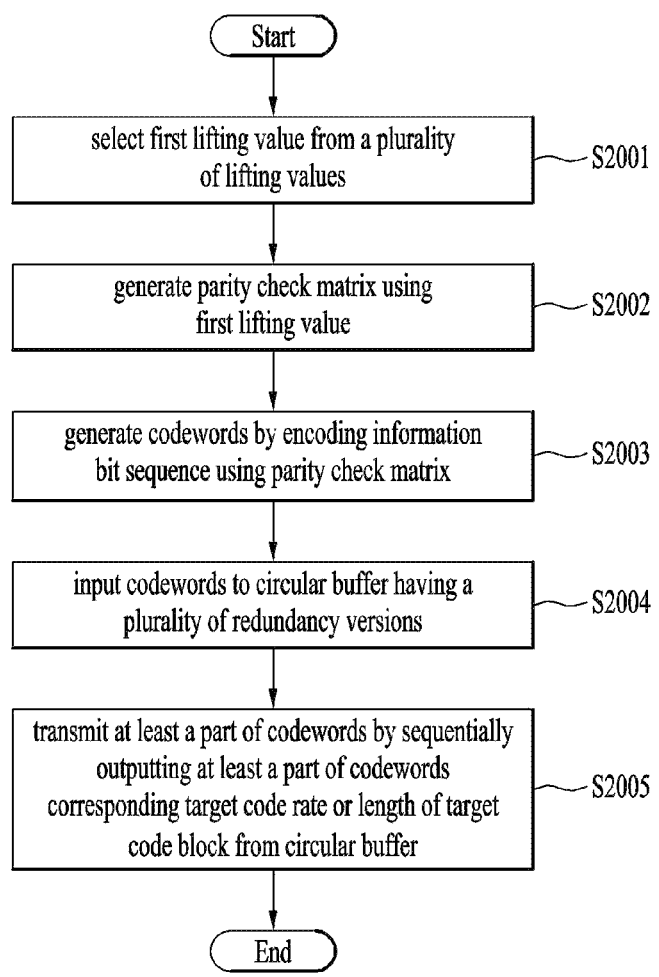
FIG. 20 is a flowchart illustrating a rate matching method of LDPC code according to one embodiment.

FIG. 20 is a flowchart illustrating a rate matching method of LDPC code according to one embodiment.

A first lifting value may be selected from a plurality of lifting values (S2001). The first lifting value may be selected by the aforementioned methods. For example, the first lifting value may be determined based on at least one of a length of an information bit, a target code rate, a length of a target code block, and a target redundancy parameter. For example, the first lifting value may be selected from the plurality of lifting values such that a length of an information block of a codeword generated from a parity check matrix generated by the first lifting value becomes a minimum value which is more than a length of a coded information bit. Alternatively, the first lifting value may be selected such that a length of a bit shortened from the codeword information block generated from the parity check matrix is minimized. Also, for example, the first lifting value may be selected from the plurality of lifting values such that the length of the codeword generated from the parity check matrix generated by the first lifting value becomes a minimum value which is more than a length of a target codeword.

The parity check matrix may be generated using the selected first lifting value (S2002). For example, the parity check matrix may be generated from a preset matrix and the first lifting value. The preset matrix may be a base matrix. The base matrix may be an identity matrix of a preset size. For example, the parity check matrix may be generated by lifting the preset matrix using the first lifting value. For example, the preset matrix may be generated by lifting the base matrix using the greatest value of the plurality of lifting values. The parity check matrix may be generated by scaling the preset matrix using the first lifting value. For example, elements which do not correspond to a zero matrix from a characteristic matrix of the preset matrix may be subjected to modulo computation by the first lifting value, whereby the parity check matrix may be generated.

The information bits may be coded using the generated parity check matrix to generate a codeword (S2003). Also, shortening may be performed for rate matching. For example, a zero(0)-bit block may be added to the information bits. Also, after encoding, a part corresponding to the added zero-bit block may be removed from the codeword. In this case, instead of the zero-bit block, a bit block having the known bit value may be used.

The codeword may include an information block and a parity block. Also, the parity block may partially be punctured. For example, the parity block may be interleaved in a unit corresponding to the first lifting value. The interleaved parity block may be punctured sequentially from the last bit until it reaches the target codeword length or the target code rate. Also, the information block may partially be punctured.

The generated codewords are input to the circular buffer having a plurality of redundancy versions (S2004). Also, the codewords equivalent to the target code rate or the target codeword length may be output sequentially from the circular buffer, whereby at least a part of the codewords may be transmitted (S2005). Also, if retransmission is performed, the codewords may partially be transmitted from the position where the redundancy versions are increased. The redundancy versions may be increased in accordance with repetition of retransmission. For example, retransmission may be performed when information indicating NACK (Negative ACKnowledgement) or DTX (Discontinuous Transmission) is received from the receiving end.

Also, at least one of the length of the information bit, the length of the target codeword, the target redundancy version, the target code rate, and the first lifting value may be transmitted to the receiving end. For example, the aforementioned information may be transmitted through uplink control information or downlink control information.

Figure 21:
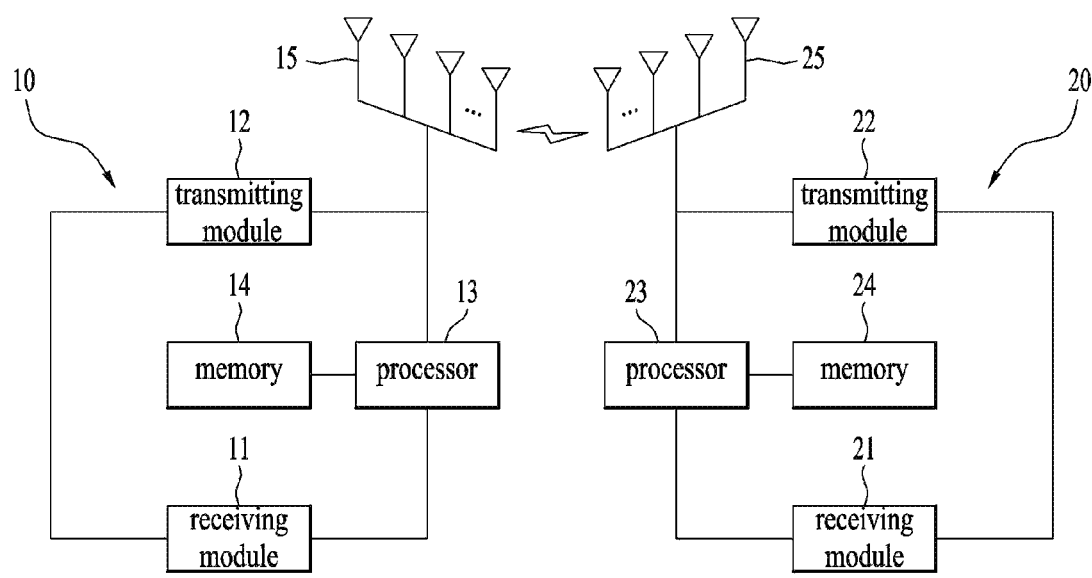
FIG. 21 is a block diagram illustrating configurations of a base station (BS) and a user equipment (UE) according to an embodiment of the present disclosure.

FIG. 21 is a schematic diagram for explanation of components of apparatuses to which the embodiments of the present invention of FIGS. 1 to 20 are applicable, according to an embodiment of the present invention.

Referring to FIG. 21, a BS apparatus 10 according to the present invention may include a receiving module 11, a transmitting module 12, a processor 13, a memory 14, and a plurality of antennas 15. The transmitting module 12 may transmit various signals, data, and information to an external apparatus (e.g., a UE). The receiving module 11 may receive various signals, data, and information from an external apparatus (e.g., a UE). The receiving module 11 and the transmitting module 12 may each be referred to as a transceiver. The processor 13 may control an overall operation of the BS apparatus 10. The antennas 15 may be configured according to, for example, 2-dimensional (2D) antenna arrangement.

The processor 13 of the BS apparatus 10 according to an embodiment of the present invention may be configured to receive channel state information according to proposed embodiments of the present invention. In addition, the processor 13 of the BS apparatus 10 may perform a function for calculating and processing information received by the BS apparatus 10 and information to be externally transmitted, and the memory 14 may store the calculated and processed information for a predetermined time period and may be replaced with a component such as a buffer (not shown) or the like.

Referring to FIG. 21, a UE apparatus 20 according to the present invention may include a receiving module 21, a transmitting module 22, a processor 23, a memory 24, and a plurality of antennas 25. The antennas 25 refer to a terminal apparatus for supporting MIMO transmission and reception. The transmitting module 22 may transmit various signals, data, and information to an external apparatus (e.g., an eNB). The receiving module 21 may receive various signals, data, and information from an external apparatus (e.g., an eNB). The receiving module 21 and the transmitting module 22 may each be referred to as a transceiver. The processor 23 may control an overall operation of the UE apparatus 20.

The processor 23 of the UE apparatus 20 according to an embodiment of the present invention may be configured to transmit channel state information according to proposed embodiments of the present invention. In addition, the processor 23 of the UE apparatus 20 may perform a function for calculating and processing information received by the UE apparatus 20 and information to be externally transmitted, and the memory 24 may store the calculated and processed information for a predetermined time period and may be replaced with a component such as a buffer (not shown) or the like.

The aforementioned components of the BS apparatus 10 and the UE apparatus 20 may be embodied by independently applying the above description of the present invention or simultaneously applying two or more embodiments of the present invention, and a repeated description is not given for clarity.

In addition, with regard to the various embodiments of the present invention, although an example in which a downlink transmission entity or an uplink reception entity is an eNB and a downlink reception entity or an uplink transmission entity is a UE has been described, the scope of the present invention is not limited thereto. For example, the above description of the eNB may be applied in the same way to the case in which a cell, an antenna port, an antenna port group, an RRH, a transmission point, a reception point, an access point, a relay, etc. are a downlink transmission entity to a UE or an uplink reception entity from the UE. In addition, the principle of the present invention that has been described with regard to the various embodiments of the present invention may also be applied in the same way to the case in which a relay is a downlink transmission entity to a UE or an uplink reception entity to a UE or the case in which a relay is an uplink transmission entity to an eNB or a downlink reception entity from an eNB.

The embodiments of the present disclosure may be achieved by various means, for example, hardware, firmware, software, or a combination thereof.

In a hardware configuration, an embodiment of the present disclosure may be achieved by one or more application specific integrated circuits (ASICs), digital signal processors (DSPs), digital signal processing devices (DSDPs), programmable logic devices (PLDs), field programmable gate arrays (FPGAs), processors, controllers, microcontrollers, microprocessors, etc.

In a firmware or software configuration, an embodiment of the present disclosure may be implemented in the form of a module, a procedure, a function, etc. Software code may be stored in a memory unit and executed by a processor. The memory unit is located at the interior or exterior of the processor and may transmit and receive data to and from the processor via various known means.

The embodiments of the present disclosure described above are combinations of elements and features of the present disclosure. The elements or features may be considered selective unless otherwise mentioned. Each element or feature may be practiced without being combined with other elements or features. Further, an embodiment of the present disclosure may be constructed by combining parts of the elements and/or features. Operation orders described in embodiments of the present disclosure may be rearranged. Some constructions of any one embodiment may be included in another embodiment and may be replaced with corresponding constructions of another embodiment. It is obvious to those skilled in the art that claims that are not explicitly cited in each other in the appended claims may be presented in combination as an embodiment of the present disclosure or included as a new claim by a subsequent amendment after the application is filed.

It will be apparent to those skilled in the art that various modifications and variations may be made in the present disclosure without departing from the spirit or scope of the disclosures. Thus, it is intended that the present disclosure covers the modifications and variations of this disclosure provided they come within the scope of the appended claims and their equivalents.

INDUSTRIAL APPLICABILITY

The embodiments of the present disclosure are applicable to various wireless access systems and broadcasting communication systems. Examples of the various wireless access systems include a 3rd generation partnership project (3GPP) system, a 3GPP2 system, and/or an institute of electrical and electronics engineers (IEEE) 802.xx system. The embodiments of the present disclosure may be applied to all technical fields in which the various wireless access systems find their applications, as well as the various wireless access systems.

The invention claimed is:

1. A method of a Base Station (BS) for transmitting an information block to a User Equipment (UE) based on quasi-cyclic Low Density Parity Check (LDPC) in a wireless communication system, the method comprising:
configuring a target code rate for a transmission unit of the information block;
acquiring a lifting value for encoding of the information block;
transmitting, to the UE, first information related to the target code rate, second information related to the lifting value and third information related to a length of the information block;
encoding the information block based on the lifting value; and
transmitting, to the UE, the encoded information block based on the transmission unit,
wherein the lifting value is acquired based on a length of the encoded information block and the target code rate.

2. The method of claim 1, wherein the target code rate is configured to maximize coding gain for the information block based on power gain and coding gain.

3. The method of claim 1,
wherein the lifting value is a minimum value among a plurality of lifting values,
wherein the plurality of lifting values are used such that the length of the encoded information block is equal to or greater than a length of the transmission unit.

4. The method of claim 1, wherein the lifting value is used for a Parity Check Matrix related to the encoding of the information block by lifting a base matrix.

5. The method of claim 1, wherein transmissions of the encoded information block are performed until entire of the encoded information block is transmitted.

6. The method of claim 5, wherein a last transmission of the encoded information block includes part of parity block not transmitted before the last transmission and part of the information block.

7. The method of claim 1, wherein transmissions of the encoded information block are performed based on redundancy versions of a circular buffer.

8. The method of claim 1, wherein the lifting value is acquired based on a number of transmissions for transmitting entire of the encoded information block.

9. The method of claim 1, wherein the first information, the second information, and the third information are transmitted based on Downlink Control Information (DCI).

10. A method of a User Equipment (UE) for transmitting a Hybrid Automatic Repeat Request-Acknowledge (HARQ-ACK) signal to a Base Station (BS) based on quasi-cyclic Low Density Parity Check (LDPC) in a wireless communication system, the method comprising:
receiving, from the BS, first information related to a target code rate for a transmission unit of an information block, second information related to a lifting value for encoding of the information block and third information related to a length of the information block;
receiving, from the BS, an encoded information block transmitted based on the transmission unit;
decoding the encoded information block based on the first information, the second information and the third information; and
transmitting, to the BS, a HARQ-ACK signal for the information block based on result of the decoding,
wherein the lifting value is based on a length of the encoded information block and the target code rate.

11. A Base Station (BS) transmitting an information block to a User Equipment (UE) based on quasi-cyclic Low Density Parity Check (LDPC) in a wireless communication system, the BS comprising:
a transceiver for transmitting a signal; and
at least one processor for controlling the transceiver, the at least one processor configured to:
configure a target code rate for a transmission unit of the information block;
acquire a lifting value for encoding of the information block;
control the transceiver to transmit, to the UE, first information related to the target code rate, second information related to the lifting value and third information related to a length of the information block;
encode the information block based on the lifting value; and
control the transceiver to transmit, to the UE, an encoded information block based on the transmission unit,
wherein the lifting value is acquired based on a length of the encoded information and the target code rate.

12. A User Equipment (UE) transmitting a Hybrid Automatic Repeat Request-Acknowledge (HARQ-ACK) signal to a Base Station (BS) based on quasi-cyclic Low Density Parity Check (LDPC) in a wireless communication system, the UE comprising:
a transceiver for transmitting and receiving a signal; and
at least one processor for controlling the transceiver, the at least one processor configured to:
control the transceiver to receive, from the BS, first information related to a target code rate for a transmission unit of an information block, second information related to a lifting value for encoding of the information block and third information related to a length of the information block;
control the transceiver to receive, from the BS, an encoded information block transmitted based on the transmission unit;
decode the encoded information block based on the first information, the second information and the third information; and
control the transceiver to transmit, to the BS, a HARQ-ACK signal for the information block based on result of the decoding,
wherein the lifting value is based on a length of the encoded information and the target code rate.

13. An Apparatus transmitting a Hybrid Automatic Repeat Request-Acknowledge (HARQ-ACK) signal to a Base Station (BS) based on quasi-cyclic Low Density Parity Check (LDPC) in a wireless communication system, the apparatus comprising:
a memory; and
at least one processor coupled to the memory and configured to:
receive, from the BS, first information related to a target code rate for a transmission unit of an information block, second information related to a lifting value for encoding of the information block and third information related to a length of the information block;
receive, from the BS, an encoded information block transmitted based on the transmission unit;
decode the encoded information block based on the first information, the second information and the third information; and
transmit, to the BS, a HARQ-ACK signal for the information block based on result of the decoding,
wherein the lifting value is based on a length of the encoded information and the target code rate.

* * * * *